US010615066B2

United States Patent
Chiba et al.

(10) Patent No.: US 10,615,066 B2
(45) Date of Patent: Apr. 7, 2020

(54) SUBSTRATE WARPING MONITORING DEVICE AND SUBSTRATE PROCESSING APPARATUS USING THE SAME, AND SUBSTRATE WARPING MONITORING METHOD

(71) Applicant: TOKYO ELECTRON LIMITED, Tokyo (JP)

(72) Inventors: Toshiya Chiba, Iwate (JP); Yuya Sasaki, Iwate (JP); Junnosuke Taguchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/025,560

(22) Filed: Jul. 2, 2018

(65) Prior Publication Data

US 2019/0013224 A1 Jan. 10, 2019

(30) Foreign Application Priority Data

Jul. 5, 2017 (JP) .................................. 2017-131836

(51) Int. Cl.
*H01L 21/67* (2006.01)
*C23C 16/52* (2006.01)
(Continued)

(52) U.S. Cl.
CPC .... *H01L 21/67288* (2013.01); *C23C 16/4584* (2013.01); *C23C 16/52* (2013.01);
(Continued)

(58) Field of Classification Search
CPC ......... H01L 21/67288; H01L 21/68764; H01L 21/02271; H01L 21/02; H01L 21/02164;
(Continued)

(56) References Cited

U.S. PATENT DOCUMENTS

2009/0269863 A1* 10/2009 Tomita .............. H01L 21/28518
438/7
2013/0193108 A1* 8/2013 Zheng .................... C23C 14/54
216/59
(Continued)

*Primary Examiner* — Tri T Ton
(74) *Attorney, Agent, or Firm* — Nath, Goldberg & Meyer; Jerald L. Meyer

(57) ABSTRACT

There is provided a substrate warping monitoring device for monitoring a warping of a substrate mounted in a substrate mounting region formed in a rotary table along a circumferential direction during rotation of the rotary table, including: an optical displacement meter located above the rotary table and configured to irradiate a light to a predetermined position on the rotary table, receive a reflected light reflected off the rotary table and the substrate which passes through the predetermined position and measure a surface profile of the substrate; a memory part configured to store a measurement value acquired when the light is irradiated on a predetermined reference surface, as a reference value; and a calculation part configured to calculate a warping amount of the substrate based on the surface profile of the substrate measured by the optical displacement meter and the reference value stored in the memory part.

21 Claims, 19 Drawing Sheets

(51) Int. Cl.
    *C23C 16/458*     (2006.01)
    *G01B 11/16*     (2006.01)
    *H01L 21/687*     (2006.01)
    *H01L 21/02*     (2006.01)

(52) U.S. Cl.
    CPC ........ G01B 11/16 (2013.01); H01L 21/68764 (2013.01); H01L 21/68771 (2013.01); *H01L 21/02164* (2013.01); *H01L 21/02271* (2013.01)

(58) Field of Classification Search
    CPC ......... H01L 21/67017; H01L 21/67259; H01L 21/68771; C23C 16/4584; C23C 16/52; G01B 11/16; G06K 9/00201; G06K 9/00255; G06K 9/00268; G06K 9/209; H04M 2250/52
    USPC ..... 356/600–624, 237.1–237.6, 239.1–239.8
    See application file for complete search history.

(56) References Cited

U.S. PATENT DOCUMENTS

2014/0315330 A1* 10/2014 Fujimori ............. G03F 7/70641
    438/7
2018/0144960 A1* 5/2018 Su ........................ G01B 11/306
2018/0323095 A1* 11/2018 Peh ................... H01L 21/67288

\* cited by examiner

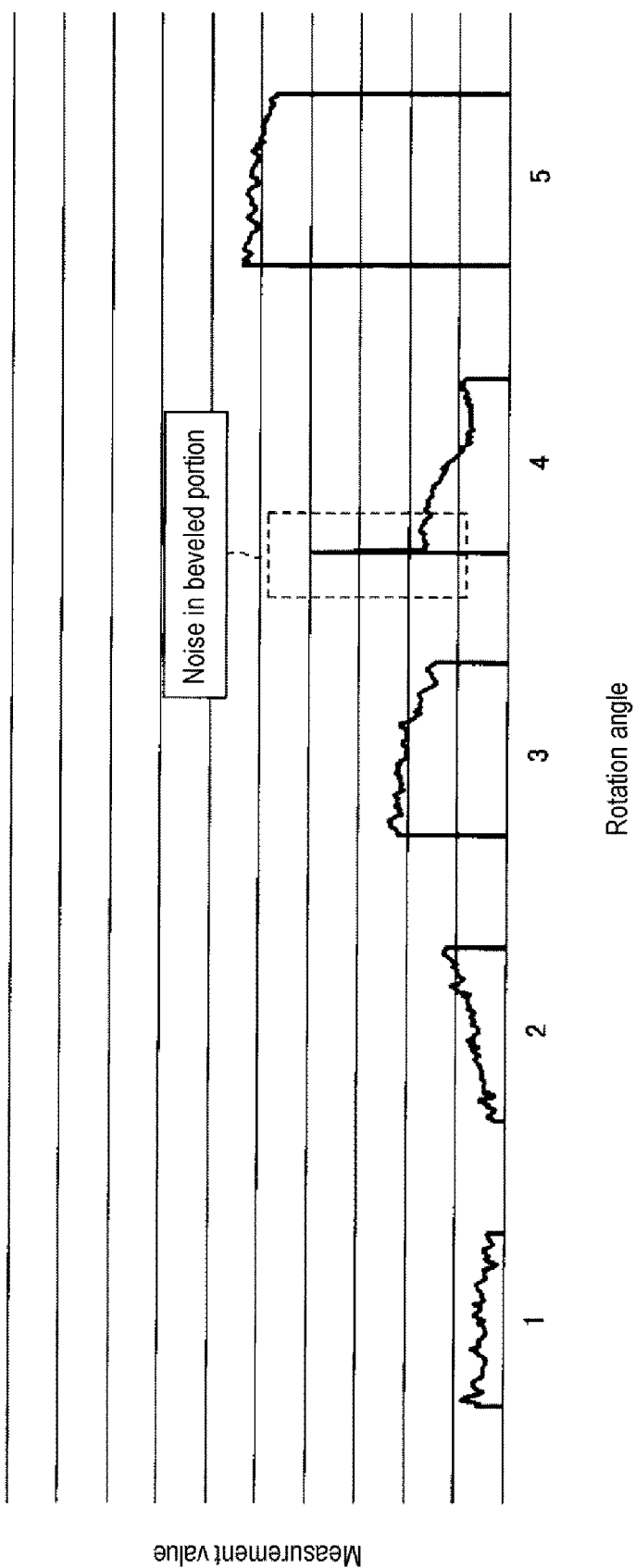

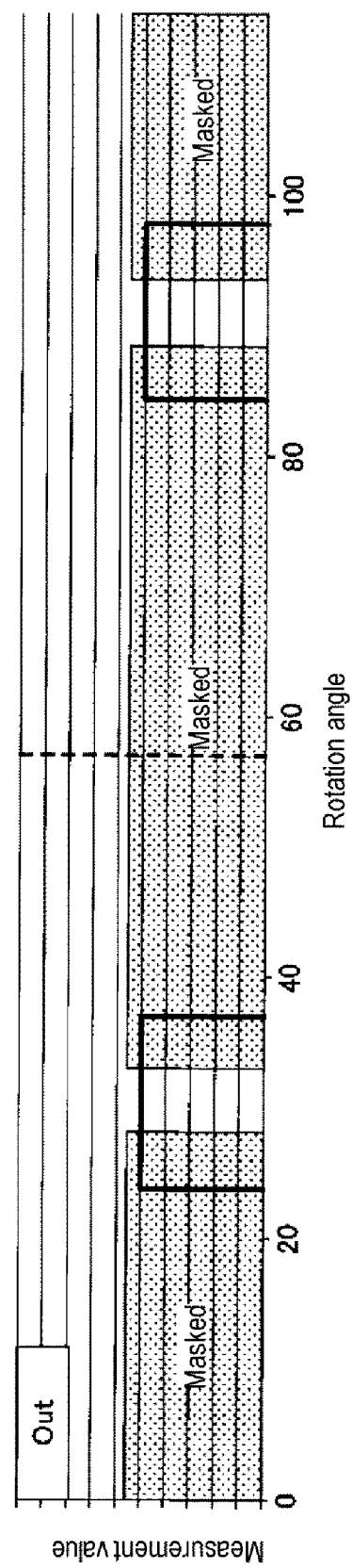

SUBSTRATE WARPING MONITORING DEVICE AND SUBSTRATE PROCESSING APPARATUS USING THE SAME, AND SUBSTRATE WARPING MONITORING METHOD

CROSS-REFERENCE TO RELATED APPLICATION

This application is based upon and claims the benefit of priority from Japanese Patent Application No. 2017-131836, filed on Jul. 5, 2017, the entire contents of which are incorporated herein by reference.

TECHNICAL FIELD

The present disclosure relates to a substrate warping monitoring device and a substrate processing apparatus using the same, and a substrate warping monitoring method.

BACKGROUND

A substrate separation detection device has been used for use in a substrate processing apparatus that processes a substrate by continuously rotating a rotary table in a state in which a substrate is mounted in a substrate mounting recess formed on a surface of the rotary table that is provided inside a chamber in a substantially horizontal posture. The substrate separation detection device includes a substrate separation determination means that determines the separation of the substrate from the recess by determining the presence or absence of the substrate in the recess during rotation of the rotary table.

In such a substrate separation detection device, a radiation thermometer is used to detect temperatures at through holes for lift pins formed in the substrate mounting recess formed in the rotary table. Separation of the substrate is detected by a difference between the detected temperatures. Alternatively, separation of the substrate is detected by an imaging means installed to capture an image of the recess. If a determination is made that the substrate is separated, the rotation of the rotary table is stopped.

However, in the configuration described above, even though the occurrence of separation of the substrate can be detected, it is not possible to predict the separation of the substrate. Thus, this type of detection method is an ex-post measure. Although the damage in the chamber, the generation of defective wafers, and the like can be reduced, it is impossible to completely avoid damage.

SUMMARY

Some embodiments of the present disclosure provide a substrate warping monitoring device and a substrate processing apparatus using the same, and a substrate warping monitoring method, which are capable of monitoring warping of a substrate during rotation of a rotary table and predicting separation of the substrate.

According to one embodiment of the present disclosure, there is provided a substrate warping monitoring device for monitoring a warping of a substrate mounted in a substrate mounting region formed in a rotary table along a circumferential direction during rotation of the rotary table, including: an optical displacement meter located above the rotary table and configured to irradiate a light to a predetermined position on the rotary table, receive a reflected light reflected off the rotary table and the substrate which passes through the predetermined position and measure a surface profile of the substrate; a memory part configured to store a measurement value acquired when the light is irradiated on a predetermined reference surface, as a reference value; and a calculation part configured to calculate a warping amount of the substrate based on the surface profile of the substrate measured by the optical displacement meter and the reference value stored in the memory part.

According to another embodiment of the present disclosure, there is provided a substrate processing apparatus, including: a processing container; a rotary table located inside the processing container and including a plurality of substrate mounting regions formed therein along a circumferential direction; a reaction gas supply nozzle configured to supply a reaction gas onto the rotary table; and the aforementioned substrate warping monitoring device.

According to another embodiment of the present disclosure, there is provided a substrate processing apparatus, including: a processing container; a rotary table located inside the processing container and including a plurality of substrate mounting regions formed therein along a circumferential direction; a reaction gas supply nozzle configured to supply a reaction gas onto the rotary table; the aforementioned substrate warping monitoring device; a control part configured to decelerate or stop the rotation of the rotary table when receiving the alarm signal issued from the substrate warping monitoring device.

According to another embodiment of the present disclosure, there is provided a substrate warping monitoring method, including: mounting a substrate on a rotary table located inside a processing container and including a substrate mounting region formed therein along a circumferential direction; irradiating a light onto a predetermined reference surface other than a surface of the substrate using an optical displacement meter and receiving a first reflected light reflected from the predetermined reference surface; storing a measurement value of the first reflected light as a first reference value; measuring a surface profile of the substrate by rotating the rotary table on which the substrate is mounted, irradiating the light onto a predetermined position on the rotary table and receiving a second reflected light reflected from the rotary table and the substrate which pass through the predetermined position, by the optical displacement meter; and calculating a warping amount of the substrate based on the surface profile of the substrate measured by the optical displacement meter and the reference value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 15 is an enlarged view of the measurement result of FIG. 13A.

FIGS. 17A to 17C are diagrams showing an example of a method for removing the noise described in FIGS. 15 and 16.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
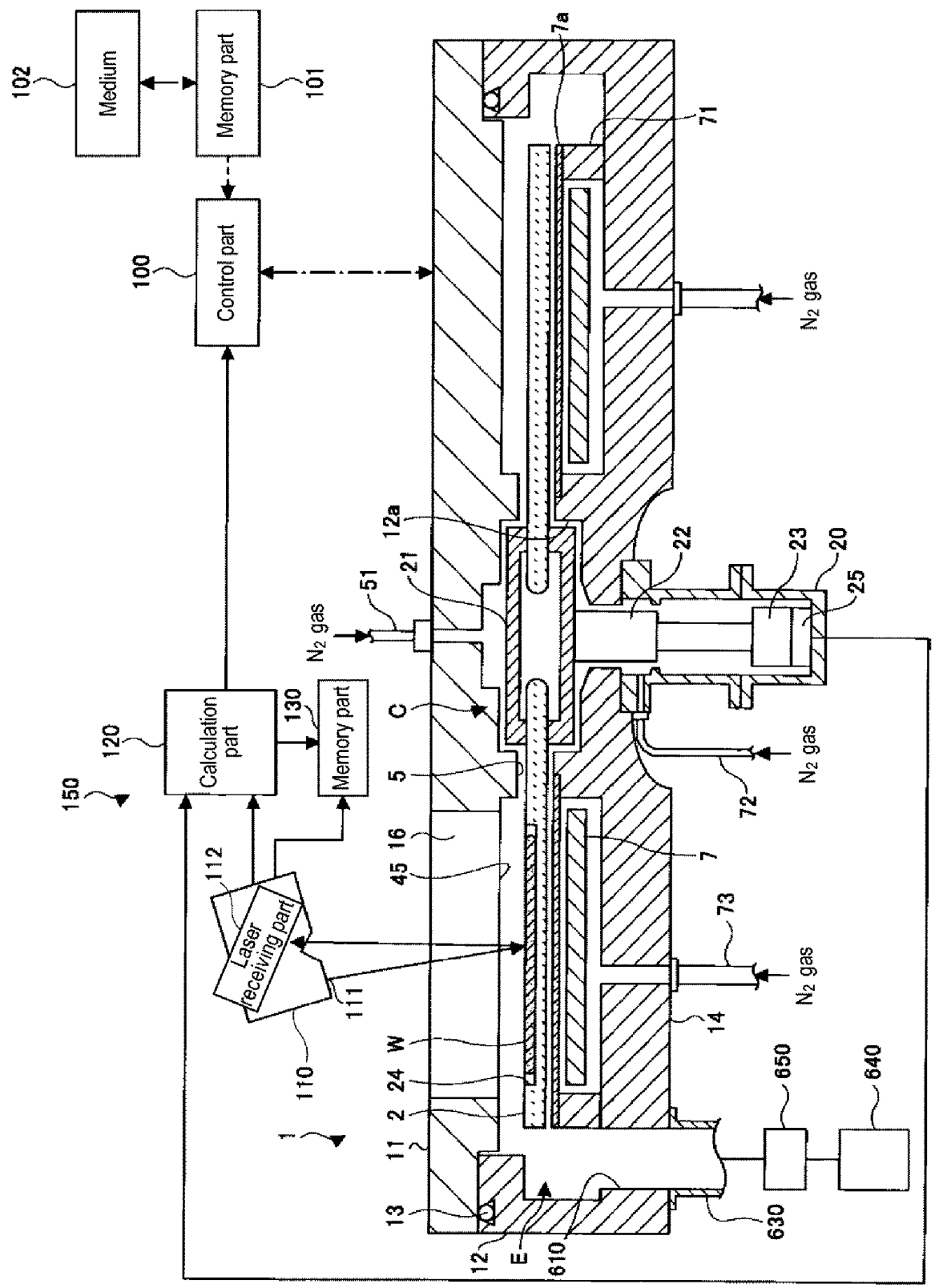
FIG. 1 is a configuration diagram showing an example of a substrate warping monitoring device according to an embodiment of the present disclosure, and a substrate processing apparatus using the same.
Figure 2:
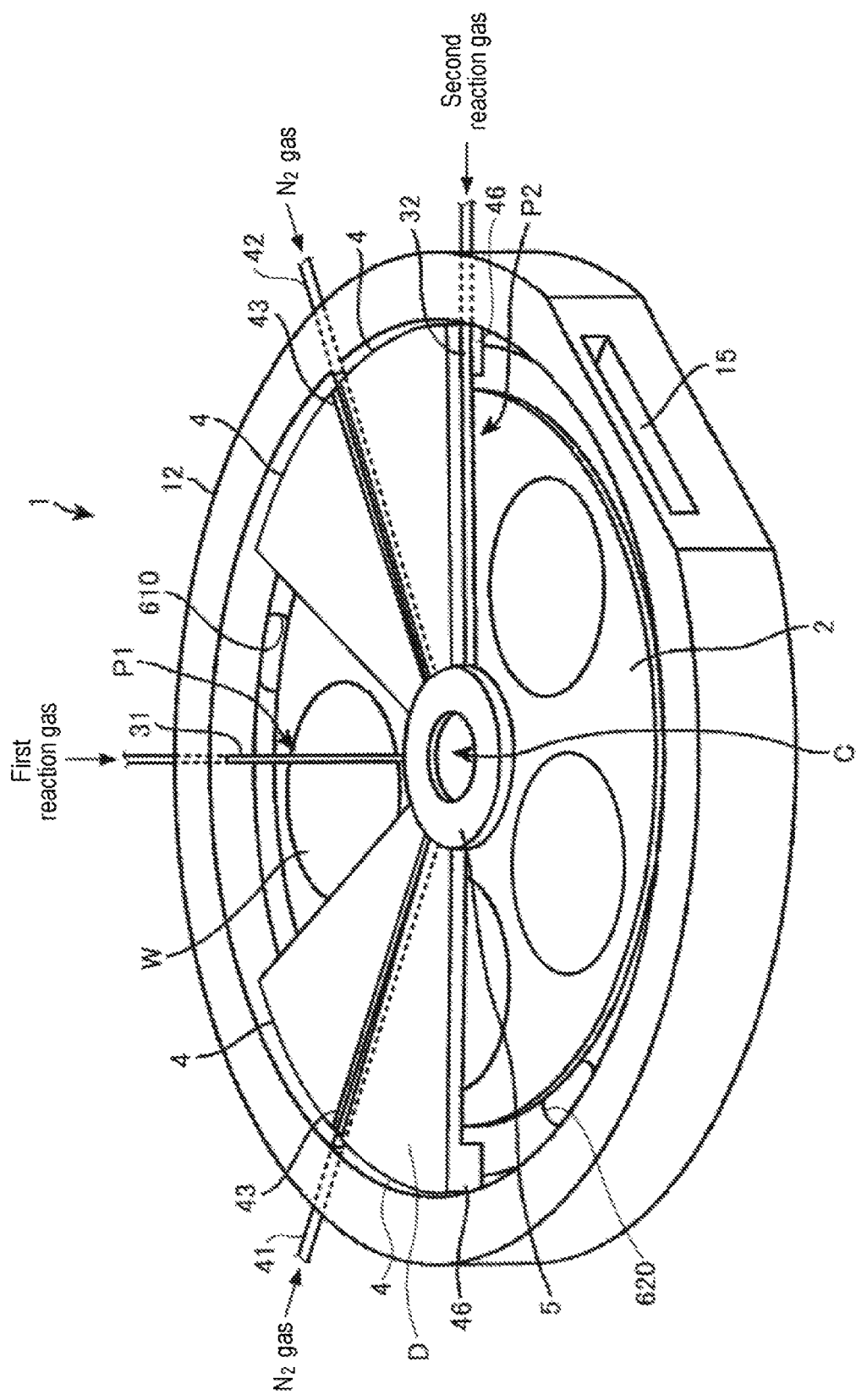
FIG. 2 is a perspective view of an internal structure of the substrate processing apparatus to which the substrate warping monitoring device according to an embodiment of the present disclosure is applied.
Figure 3:
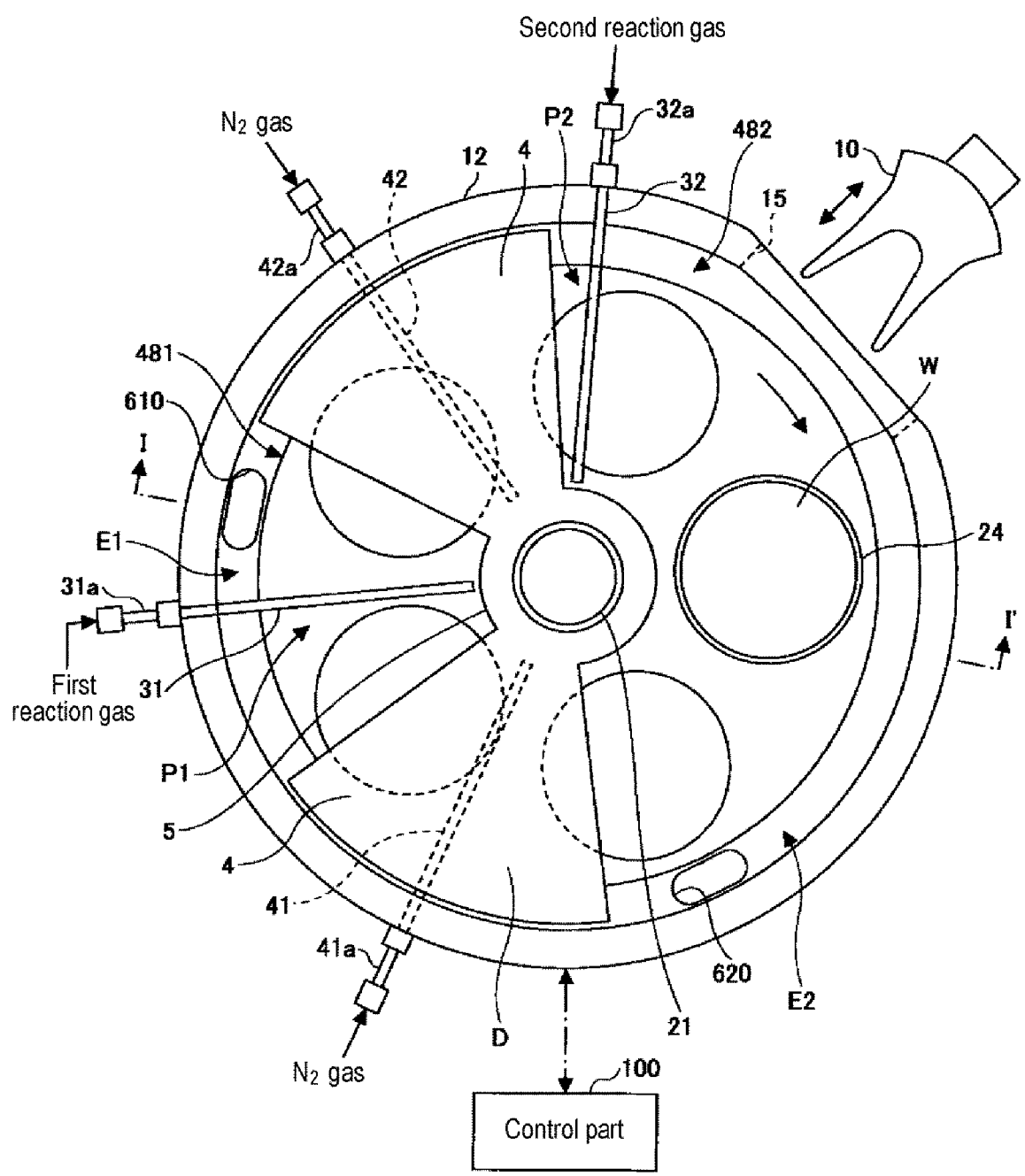
FIG. 3 is a top view of an internal structure of the substrate processing apparatus to which the substrate warping monitoring device according to an embodiment of the present disclosure is applied.

FIG. 1 is a configuration diagram showing an example of a substrate warping monitoring device according to an embodiment of the present disclosure and a substrate processing apparatus using the same. FIG. 2 is a perspective view of an internal structure of the substrate processing apparatus to which the substrate warping monitoring device according to an embodiment of the present disclosure is applied. FIG. 3 is a top view of the internal structure of the substrate processing apparatus to which the substrate warping monitoring device according to an embodiment of the present disclosure is applied.

Various substrate processing apparatuses may be used as long as they are apparatuses capable of processing a substrate while rotating a rotary table. In the present embodiment, description will be made on an example in which the substrate processing apparatus is configured as a film forming apparatus.

Referring to FIGS. 1 to 3, the film forming apparatus includes a flat chamber 1 having a substantially circular planar shape, and a rotary table 2 provided inside the chamber 1 and having a center coinciding with the center of the chamber 1. The chamber 1 is a processing container for accommodating a substrate to be processed and performing a film forming process on the substrate. As shown in FIG. 1, the chamber 1 includes a container body 12 having a bottomed cylindrical shape, and a top plate 11 arranged so as to be airtightly attachable and detachable with respect to an upper surface of the container body 12 via a sealing member 13 such as, for example, an O-ring or the like.

A window 16 is formed in a portion of the top plate 11. For example, a quartz glass is provided in the window 16, whereby the interior of the chamber 1 is visible from outside of the chamber 1.

In addition, an exhaust port 610 which is connected to a vacuum pump 640 and is referred to as a first exhaust port to be described later, is formed in the chamber 1. Thus, the chamber 1 may be configured as a vacuumable container.

The rotary table 2 is a mounting table for mounting a substrate thereon. The rotary table 2 has circular depressed recesses 24 formed therein and supports the substrate in each of the recesses 24. In FIG. 1, there is shown a state in which a semiconductor wafer W as the substrate is mounted in each of the recesses 24. The substrate is not necessarily limited to the semiconductor wafer W. Description will be made below on an example in which the semiconductor wafer W (hereinafter referred to as "wafer") is used as the substrate.

Further, an encoder 25 configured to detect a rotation angle of a rotation shaft 22 is provided in a motor 23. In the substrate warping monitoring device according to the present embodiment, in order to monitor all the warping states of the respective wafers W mounted in the respective recesses 24 of the rotary table 2, the encoder 25 is used as a means for specifying the correspondence between the recesses 24 and the wafers and the positions thereof.

A laser displacement meter 110 is provided above the window 16 of the top plate 11. The laser displacement meter 110 is a means for measuring a surface profile of the wafer W existing in the recess 24 of the rotary table 2. The laser displacement meter 110 includes a laser irradiating part 111 and a laser receiving part 112. The laser irradiating part 111 irradiates a laser beam onto the upper surface of the wafer W, and the laser receiving part 112 receives a laser beam reflected at the upper surface of the wafer W, whereby a distance between the laser displacement meter 110 and the wafer W is measured. With this configuration, when the wafer W is moved along the rotational direction by rotating the rotary table 2, it is possible to measure the surface profile of the wafer W at the respective laser irradiation position. That is to say, the distance between the laser displacement meter 110 and the wafer W varies depending on the unevenness of the surface of the wafer W. Therefore, it is possible to measure a change in unevenness in the surface of the wafer W, namely a surface profile. For example, if the laser beam is irradiated on the center of the wafer W, the surface profile of a line passing through the center of the wafer W can be measured.

In the present embodiment, there is described an example in which a laser beam is used as irradiation light and the laser displacement meter 110 is used as a displacement meter. However, various displacement meters may be used as long as they are non-contact type optical displacement meters. As an example, an LED displacement meter using LED light may be used, or a displacement meter using lamp light as a light source and capable of detecting displacement using the lamp light may be used. Alternatively, a confocal type displacement meter may be used as the displacement meter. In this way, the substrate warping monitoring device according to the present embodiment may use various displacement meters as long as they are non-contact type optical displacement meters. However, in the embodiments described below, for the sake of convenience in illustration, an example in which the laser displacement meter 110 is used will be described.

A calculation part 120 is a means for calculating a warping amount of the wafer W mounted in the recess 24 based on the surface profile information of the wafer W measured by the laser displacement meter 110. An appropriate calculation processing means may be selected as the calculation part 120 depending on the intended use. For example, the calculation part 120 may be configured as a calculation processing means such as a microcomputer including a CPU (Central Processing Unit) and a memory and operating with a program, or an ASIC (Application Specific Integrated Circuit) which is an integrated circuit designed and manufactured for a specific purpose.

The calculation part 120 calculates the warping amount of the wafer W not only based on the surface profile of the wafer W but also using a measurement value from a predetermined reference surface measured by the laser displacement meter 110 as a reference value. Details thereof will be described later.

The calculation part 120 receives a signal provided from the encoder 25. If it is determined that the warping amount of the wafer W exceeds a predetermined threshold value, the calculation part 120 also specifies the wafer W whose warping amount exceeds the threshold value and the recess 24 in which the respective wafer W is mounted. If it is determined that the warping amount of the wafer W exceeds the threshold value, the calculation part 120 outputs an alarm signal to a control part 100.

A memory part 130 is a memory means for storing a measurement value of the reference surface measured by the laser displacement meter 110. Although the memory part 130 is shown to be provided independently of the calculation part 120, the memory part 130 may be built in to the calculation part 120. That is to say, a memory provided in the calculation part 120 described above may function as the memory part 130.

The calculation part 120 calculates the warping amount of the wafer W using the measurement value of the reference surface stored in the memory part 130 as a reference value. Details of the calculation process will be described later.

The substrate warping monitoring device according to the present embodiment constantly monitors the warping of the wafer W during the wafer processing. When the warping amount of the wafer W exceeds a predetermined threshold value, the substrate warping monitoring device decelerates or stops the rotation of the rotary table 2 to prevent separation of the wafer W from the rotary table 2. However, the substrate warping monitoring device may also detect a state in which the wafer W is detached from the recess 24. In other words, when measuring the surface profile of the wafer W by the laser displacement meter 110, even in a case where the wafer W is not present in the recess 24, the laser beam is irradiated onto the bottom surface of the recess 24 of the rotary table 2. Therefore, it is possible to obtain information clearly different from the information obtained when the laser beam is irradiated onto the wafer W. Accordingly, even when the wafer W is detached, the detached wafer W can be detected by the substrate warping monitoring device according to the present embodiment. Details thereof will also be described later.

A combination of the laser displacement meter 110, the calculation part 120, the memory part 130 and the encoder 25 constitutes a substrate warping monitoring device 150 according to the present embodiment.

The control part 100 is a control means for controlling the entire film forming apparatus and may be configured as a calculation processing means composed of a computer. Upon receiving the alarm signal from the calculation part 120, the control part 100 controls the deceleration or termination of the rotation of the rotary table 2. As a result, when the warping amount of the respective wafer W in the recess 24 increases and the separation of the wafer W is likely to occur, the control part 100 promptly decelerates or stops the rotation of the rotary table 2. This makes it possible to prevent, in advance, the respective wafer W from causing damage to the interior of the chamber 1 or causing damage to another wafer W.

When the separation of the wafer W from the recess 24 is detected, the control part 100 stops the rotation of the rotary table 2. This is because, when such a separation occurs, it becomes necessary to quickly stop the rotation of the rotary table 2 to prevent damage of the interior of the chamber 1 as soon as possible.

A memory of the control part 100 stores a program for causing the film forming apparatus to perform a predetermined film forming method, including the deceleration or termination of the rotation of the rotary table 2 based on the alarm signal from the substrate warping monitoring device 150, under the control of the control part 100. The program includes a group of steps organized so as to execute the predetermined film forming method in addition to a process of decelerating and stopping the rotation of the rotary table 2. The program is stored in a medium 102 such as a hard disk, a compact disk, a magneto-optical disk, a memory card, a flexible disk or the like. The program is read in a memory part 101 by a predetermined reading device and installed on the control part 100.

Next, the configuration of the film forming apparatus will be described in detail with reference to FIGS. 2 to 5.

As shown in FIGS. 2 and 3, a plurality of circular recesses 24 for mounting a plurality of (five, in this example) semiconductor wafers W as substrates therein is formed along the rotational direction (circumferential direction). In FIG. 3, for the sake of convenience in description, the wafer W is shown to be mounted only in one recess 24. The recess 24 has an inner diameter which is, for example, 4 mm larger than that of the wafer W, and a depth which is substantially equal to or larger than the thickness of the wafer W. Therefore, when the wafer W is accommodated in the recess 24, the surface of the wafer W and the surface of the rotary table 2 (a region where the wafer W is not mounted) are at the same height, or the surface of the wafer W is lower than the surface of the rotary table 2. Even in the case where the depth of the recess 24 is larger than the thickness of the wafer W, it is preferable to set the depth of the recess 24 to about three times the thickness of the wafer W, because the film formation may be affected if the depth of the recess 24 is too large. Through holes (not shown) into which, for example, three lift pins for supporting a back surface of the wafer W and moving the wafer W up and down are inserted, are formed in the bottom surface of the recess 24.

FIGS. 2 and 3 are diagrams for explaining the internal structure of the chamber 1. Illustration of the top plate 11 is omitted for the sake of convenience in description. As shown in FIGS. 2 and 3, a reaction gas nozzle 31, a reaction gas nozzle 32 and separation gas nozzles 41 and 42, which are made of, for example, quartz, are arranged above the rotary table 2 at intervals in the circumferential direction of the chamber 1 (in the rotational direction of the rotary table 2, indicated by an arrow A in FIG. 3). In the illustrated example, the separation gas nozzle 41, the reaction gas nozzle 31, the separation gas nozzle 42 and the reaction gas nozzle 32 are arranged in the named order in a clockwise direction (in the rotational direction of the rotary table 2) from a transfer port 15 (to be described later). These nozzles 31, 32, 41 and 42 are introduced into the chamber 1 from an outer peripheral wall of the chamber 1 by fixing gas introduction ports 31a, 32a, 41a and 42a (see FIG. 3), which are base end portions of the respective nozzles 31, 32, 41 and 42, to the outer peripheral wall of the container body 12. The nozzles 31, 32, 41 and 42 are attached so as to extend horizontally with respect to the rotary table 2 along the radial direction of the container body 12.

The reaction gas nozzle 31 is connected to a supply source (not shown) of a first reaction gas via a pipe (not shown), a flow rate controller (not shown) and the like. The reaction gas nozzle 32 is connected to a supply source (not shown) of a second reaction gas via a pipe (not shown), a flow rate controller (not shown) and the like. Both the separation gas nozzles 41 and 42 are connected to a supply source (not shown) of, for example, a nitrogen ($N_2$) gas as a separation gas, via a pipe (not shown), a flow rate control valve (not shown) and the like. When plasma is used, argon (Ar) is often used as the separation gas. Thus, as the separation gas, an inert gas or a noble gas may be suitably used depending on the intended use.

In each of the reaction gas nozzles 31 and 32, a plurality of gas discharge holes 33 opened toward the rotary table 2 are arranged at intervals of, for example, 10 mm along the length direction of each of the reaction gas nozzles 31 and 32. A region below the reaction gas nozzle 31 is defined as a first processing region P1 where the first reaction gas is adsorbed onto the wafer W. A region below the reaction gas nozzle 32 is defined as a second processing region P2 where the first reaction gas adsorbed onto the wafer W in the first processing region P1 reacts with the second reaction gas.

Referring to FIGS. 2 and 3, two convex portions 4 are formed inside the chamber 1. The convex portions 4 are attached to the back surface of the top plate 11 so as to protrude toward the rotary table 2 as described later, so that the convex portions 4 form separation regions D together with the separation gas nozzles 41 and 42. In addition, each of the convex portions 4 has a fan-like planar shape whose apex is cut in an arc shape. In the present embodiment, the inner arc is connected to a protrusion portion 5 (to be described later), and the outer arc is arranged so as to extend along an inner circumferential surface of the container body 12 of the chamber 1.

Figure 4:
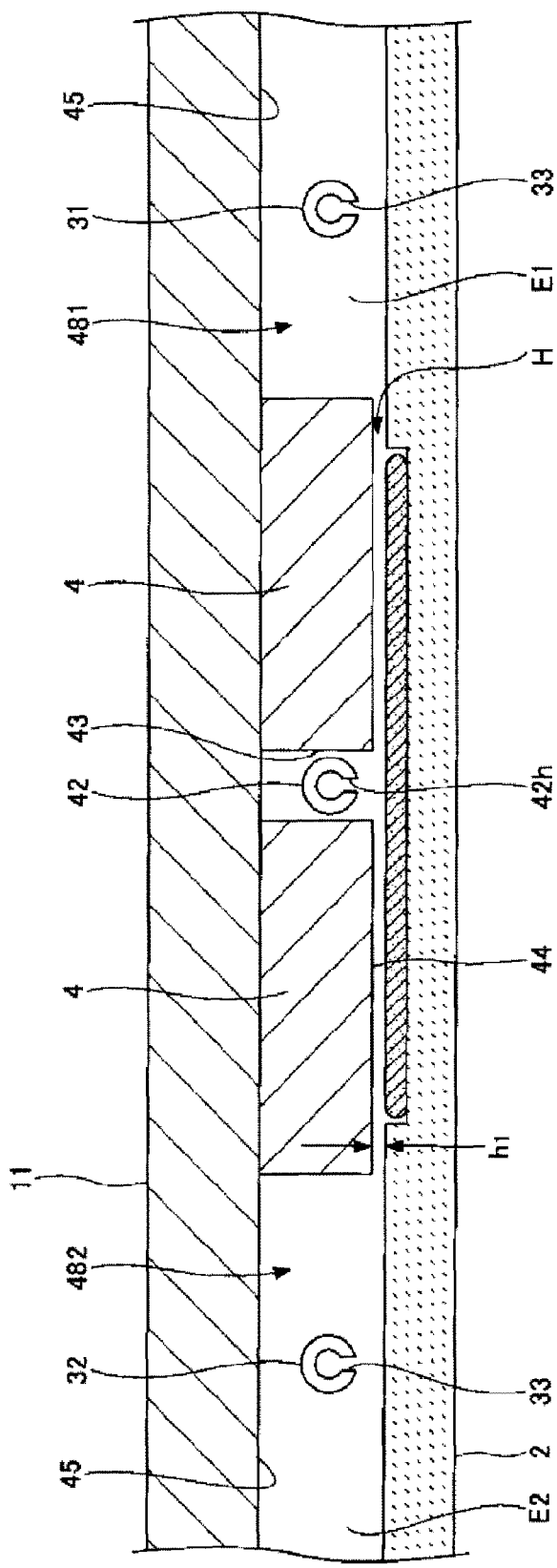
FIG. 4 is a view showing a cross section of a chamber taken along a concentric circle of a rotary table.

FIG. 4 shows a cross section of the chamber 1 taken in a concentric relationship with the rotary table 2 from the reaction gas nozzle 31 to the reaction gas nozzle 32. As shown in FIG. 4, since the convex portions 4 are attached to the back surface of the top plate 11, the chamber 1 has a flat low-level ceiling surface 44 (a first ceiling surface), which is a lower surface of each of the convex portions 4, and a high-level ceiling surface 45 (a second ceiling surface), which is higher than the ceiling surface 44 and located at both sides of the ceiling surface 44 in the circumferential direction. The ceiling surface 44 has a fan-like planar shape whose apex is cut in an arc shape. As shown in FIG. 4, a groove 43 extending in the radial direction is formed at the circumferential center of the convex portion 4. The separation gas nozzle 42 is accommodated in the groove 43. Similarly, another groove 43 is formed in another convex portion 4. The separation gas nozzle 41 is accommodated in the another groove 43. In addition, the reaction gas nozzles 31 and 32 are respectively provided in a space below the high-level ceiling surface 45. These reaction gas nozzles 31 and 32 are provided in the vicinity of the wafer W apart from the ceiling surface 45. For the sake of convenience in description, as shown in FIG. 4, a space below the high-level ceiling surface 45 where the reaction gas nozzle 31 is provided is denoted by reference numeral 481, and a space below the high-level ceiling surface 45 where the reaction gas nozzle 32 is provided is denoted by reference numeral 482.

Furthermore, in the separation gas nozzles 41 and 42 accommodated in the respective grooves 43 of the convex portions 4, a plurality of gas discharge holes 42h (see FIG. 4) opened toward the rotary table 2 is arranged at intervals of, for example, 10 mm along the length direction of the separation gas nozzles 41 and 42.

The low-level ceiling surface 44 forms a separation space H, which is a narrow space, with respect to the rotary table 2. When an $N_2$ gas is supplied from the discharge holes 42h of the separation gas nozzle 42, the $N_2$ gas flows toward the space 481 and the space 482 through the separation space H. At this time, an internal pressure of the separation space H can be made higher than internal pressures of the spaces 481 and 482 by the supply of the $N_2$ gas because the volume of the separation space H is smaller than those of the spaces 481 and 482. That is to say, the separation space H having a high pressure is formed between the spaces 481 and 482. The $N_2$ gas flowing out from the separation space H into the spaces 481 and 482 acts as a counter-flow against the first reaction gas from the first processing region P1 and the second reaction gas from the second processing region P2. Therefore, the first reaction gas from the first processing region P1 and the second reaction gas from the second processing region P2 are separated from each other by the separation space H. Accordingly, the first reaction gas and the second reaction gas are prevented from mixing and reacting with each other inside the chamber 1.

A height h1 of the ceiling surface 44 with respect to the upper surface of the rotary table 2 may be set to a height suitable for making the internal pressure of the separation space H higher than the internal pressures of the spaces 481 and 482, in consideration of an internal pressure of the chamber 1 at the time of film formation, the rotation speed of the rotary table 2, the supply amount of separation gas ($N_2$ gas) to be supplied, and the like.

Meanwhile, a protrusion portion 5 (see FIGS. 2 and 3) which surrounds the outer periphery of a core portion 21 for fixing the rotating table 2 is provided in a lower surface of the top plate 11. In the present embodiment, the protrusion portion 5 is continuous with portions of rotational center sides of the convex portions 4. A lower surface of the protrusion portion 5 is formed at the same height as the ceiling surface 44.

Figure 5:
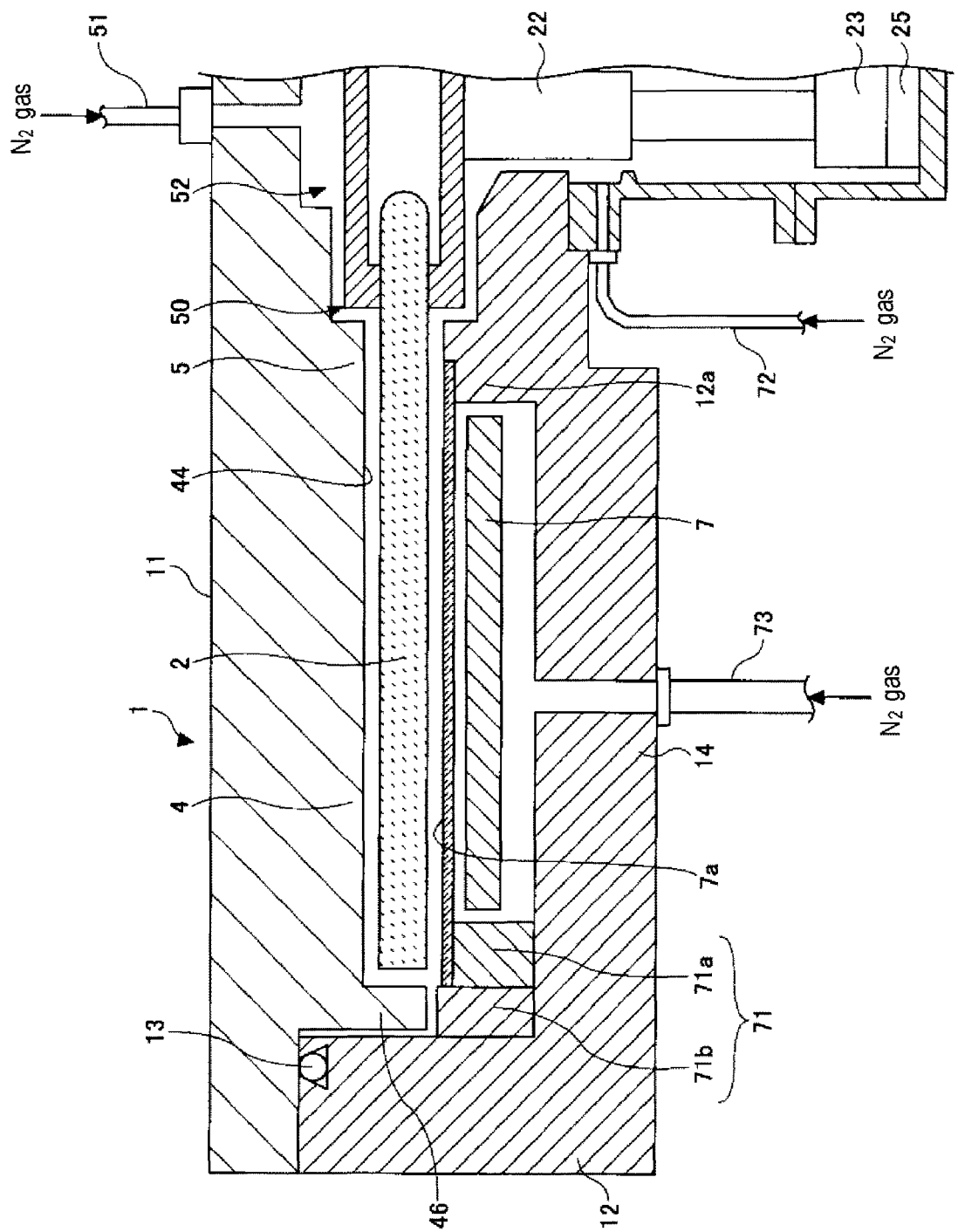
FIG. 5 is a sectional view showing a region inside a chamber where a ceiling surface is provided.

FIG. 1 referred to above is a cross-sectional view taken along line I-I' in FIG. 3 and shows a region where the ceiling surface 45 is provided. On the other hand, FIG. 5 is a sectional view showing a region where the ceiling surface 44 is provided. As shown in FIG. 5, a bent portion 46 bent in an L shape so as to face an outer end surface of the rotary table 2 is formed at the peripheral edge portion of the fan-shaped convex portion 4 (the portion on the outer edge side of the chamber 1). Similar to the convex portion 4, the bent portion 46 suppresses the entry of the reaction gases from both sides of the separation region D and suppresses the mixing of both reaction gases. Since the fan-shaped convex portion 4 is provided in the top plate 11 which can be removed from the container body 12, a small gap is present between an outer circumferential surface of the bent portion 46 and the container body 12. For example, a gap between an inner circumferential surface of the bent portion 46 and the outer end surface of the rotary table 2, and a gap between the outer circumferential surface of the bent portion 46 and the container body 12 are set to be the same as the height of the ceiling surface 44 with respect to the upper surface of the rotary table 2.

In the separation region D, the inner peripheral wall of the container body 12 is formed as a vertical surface close to the outer circumferential surface of the bent portion 46 as shown in FIG. 5. However, in a region other than the separation region D, as shown in FIG. 1, for example, the inner peripheral wall of the container body 12 is formed to be recessed outward from a portion facing the outer end surface of the rotary table 2 to the side of the bottom portion 14. Hereinafter, for the sake of convenience in description, the recessed portion having a substantially rectangular cross-sectional shape is referred to as an exhaust region. More specifically, in the exhaust region, a region communicating with the first processing region P1 is referred to as a first exhaust region E1, and a region communicating with the second processing region P2 is referred to as a second exhaust region E2. As shown in FIGS. 1 to 3, the first exhaust port 610 and a second exhaust port 620 are formed below the first exhaust region E1 and the second exhaust region E2, respectively. As shown in FIG. 1, the first exhaust port 610 and the second exhaust port 620 are respectively connected to the vacuum pump 640, which is a vacuum exhaust means, via an exhaust pipe 630. As shown in FIG. 1, a pressure controller 650 is provided at the upstream side of the vacuum pump 640.

As shown in FIGS. 1 and 4, a heater unit 7 serving as a heating means is provided in a space between the rotary table 2 and the bottom portion 14 of the chamber 1. The wafer W mounted on the rotary table 2 is heated through the rotary table 2 to a temperature (for example, 450 degrees C.) determined by a process recipe. A ring-shaped cover member 71 is provided (see FIG. 5) below the outer peripheral edge of the rotary table 2. The cover member 71 separates an atmosphere which exists from the space above the rotary table 2 to the exhaust regions E1 and E2, from an atmosphere in which the heater unit 7 is placed, thus suppressing the entry of a gas into a region blow the rotary table 2. The cover member 71 includes an inner member 71a provided so as to face the outer edge portion of the rotary table 2 and outward of the outer edge portion from the lower side, and an outer member 71b provided between the inner member 71a and the inner wall surface of the chamber 1. The outer member 71b is provided below the bent portion 46 formed at the outer edge portion of the convex portion 4 in the separation area D. The inner member 71a is provided below the outer edge portion of the rotary table 2 (below the region located slightly outward of the outer edge portion of the rotary table 2) so as to surround the heater unit 7 over the entire circumference.

In the bottom portion 14, a region closer to the rotational center than the space where the heater unit 7 is disposed, is defined as a protruding portion 12a which protrudes upward so as to approach the core portion 21 in the vicinity of the central portion of the lower surface of the rotary table 2. A narrow space is formed between the protruding portion 12a and the core portion 21. A gap between an inner circumferential surface of a through hole through which the rotation shaft 22 penetrates the bottom portion 14 and the rotation shaft 22 is made narrow. These narrow spaces communicate with a case body 20. A purge gas supply pipe 72 for supplying an $N_2$ gas as a purge gas into the narrow spaces to purge the narrow spaces is connected to the case body 20. A plurality of purge gas supply pipes 73 for purging the space where the heater unit 7 is disposed, is provided in the bottom portion 14 of the chamber 1 below the heater unit 7 at predetermined angular intervals in the circumferential direction (a single purge gas supply pipe 73 is shown in FIG. 5). In order to suppress the entry of a gas into the region where the heater unit 7 is disposed, a lid member 7a that covers a region between an inner peripheral wall of the outer member 71b (an upper surface of the inner member 71a) and an upper end portion of the protruding portion 12a over the circumferential direction is provided between the heater unit 7 and the rotary table 2. The lid member 7a may be made of, for example, quartz.

Furthermore, a separation gas supply pipe 51 is connected to the central portion of the top plate 11 of the chamber 1 and is configured to supply an $N_2$ gas as a separation gas to a space 52 between the top plate 11 and the core portion 21. The separation gas supplied to the space 52 is discharged toward the outer peripheral edge along the surface of the rotary table 2 at the side of the recess 24 via a narrow gap 50 between the protrusion portion 5 and the rotary table 2. The space 50 may be maintained at a higher pressure than those of the spaces 481 and 482 by the separation gas. Therefore, by virtue of the space 50, the first reaction gas supplied to the first processing region P1 and the second reaction gas supplied to the second processing region P2 are prevented from being mixed with each other through a central region C. That is to say, the space 50 (or the central region C) may function just like the separation space H (or the separation region D).

As shown in FIGS. 2 and 3, the transfer port 15 through which the wafer W as a substrate is transferred between an external transfer arm 10 and the rotary table 2, is formed in a side wall of the chamber 1. The transfer port 15 is opened and closed by a gate valve (not shown). Since the wafer W is transferred between the recess 24 as a wafer mounting region in the rotary table 2 and the transfer arm 10 at a position facing the transfer port 15, transfer lift pins (not shown) which penetrate the recess 24 and is configured to lift the wafer W from the back surface thereof and an elevating mechanism (not shown) for elevating the lift pins are provided below the rotary table 2 in a region corresponding to the transfer position.

Next, a substrate processing method using the above-described substrate processing apparatus will be briefly described. As described above, the above-described substrate processing apparatus is configured as a film forming apparatus. Thus, description will be made on an example in which a substrate is subjected to film formation.

First, a wafer W is loaded into the chamber 1. When loading a substrate such as the wafer W or the like, the gate valve G is first opened. Then, while intermittently rotating the rotary table 2 as a susceptor, the substrate is mounted on the rotary table 2 via the transfer port 15 by the transfer arm 10.

Subsequently, the substrate warping monitoring device 150 irradiates a laser beam onto a predetermined reference surface using the laser displacement meter 110, receives a respective reflected laser beam, and stores a measurement value corresponding to the reflected laser beam in the memory part 130. As used herein, the predetermined reference surface may be, for example, the upper surface of the rotary table 2, may be a predetermined position in the chamber 1 or a surface of a predetermined component, or may be another surface existing outside the chamber 1. Details thereof will be described later.

Subsequently, the gate valve G is closed and the interior of the chamber 1 is brought to have a predetermined pressure by the vacuum pump 640 and the pressure controller 650. In this state, the wafer W is heated to a predetermined temperature by the heater unit 7 while rotating the rotary table 2. At this time, a separation gas, for example, an $N_2$ gas is supplied from the separation gas nozzles 41 and 42.

Subsequently, the first reaction gas is supplied from the first reaction gas nozzle 31, and the second reaction gas is supplied from the second reaction gas nozzle 32. Although not shown in FIGS. 2 and 3, in a case of performing a plasma modifying process, a plasma processing gas is supplied at a predetermined flow rate from a plasma processing gas nozzle.

Various gases may be used as the first reaction gas and the second reaction gas depending on the intended use. A raw material gas may be supplied from the first reaction gas nozzle 31, and an oxidizing gas or a nitriding gas may be supplied from the second reaction gas nozzle 32. In the case of performing the plasma processing, the plasma processing gas composed of a mixed gas containing an oxidizing gas or a nitriding gas similar to the oxidizing gas or the nitriding gas supplied from the second reaction gas nozzle 32 and a noble gas may be supplied from a plasma processing gas nozzle (not shown).

In the present embodiment, a case where a film to be formed is a silicon oxide film, the first reaction gas is a Si-containing gas, and the second reaction gas is an oxygen gas will be described as an example.

In the first processing region P1, the Si-containing gas is adsorbed onto the surface of the wafer W with the rotation of the rotary table 2. Subsequently, the Si-containing gas adsorbed onto the wafer W is oxidized by the oxygen gas in the second processing region P2. As a result, one or more molecular layers of a silicon oxide film, which are thin film components, are formed and a reaction product is formed. Further, when the wafer W passes through the separation region D, a separation gas such as an $N_2$ gas or the like is supplied to purge the wafer W. By rotating the rotary table 2, the molecular layers of the silicon oxide film are deposited on the surface of the wafer W, whereby a silicon oxide film is formed. In this way, in order to perform the film forming process, it is necessary to rotate the rotary table 2. However, as described above, the rotary table 2 is being heated by the heater unit 7. Therefore, warping is generated in the wafer W during the rotation of the rotary table 2. If such a warping amount increases, the wafer W may be separated from the recess 24.

Therefore, in the substrate warping monitoring device 150 and the substrate warping monitoring method according to the present embodiment, when the rotary table 2 is rotated to perform substrate processing, the warping state of the wafer W including the warping amount of the wafer W is constantly monitored. When there is a possibility of separation of the wafer W, the rotation of the rotary table 2 is decelerated or stopped to prevent separation of the wafer W from the recess 24 during the substrate processing.

Hereinafter, the contents of the substrate warping monitoring device 150 and the substrate warping monitoring method will be described in more detail. As described above, as the displacement meter used for the substrate warping monitoring device 150 and the substrate warping monitoring method, various displacement meters may be used as long as they are non-contact type optical displacement meters. As an example, an LED displacement meter, a displacement meter using a lamp light, a confocal type displacement meter or the like may be used. In the following embodiments, for the sake of convenience in description, an example in which a laser displacement meter 110 using a laser beam (hereinafter simply referred to as "laser") is used will be described. In a case where another displacement meter is used, the laser displacement meter 110 may be replaced with another displacement meter.

First Embodiment

Figure 6:
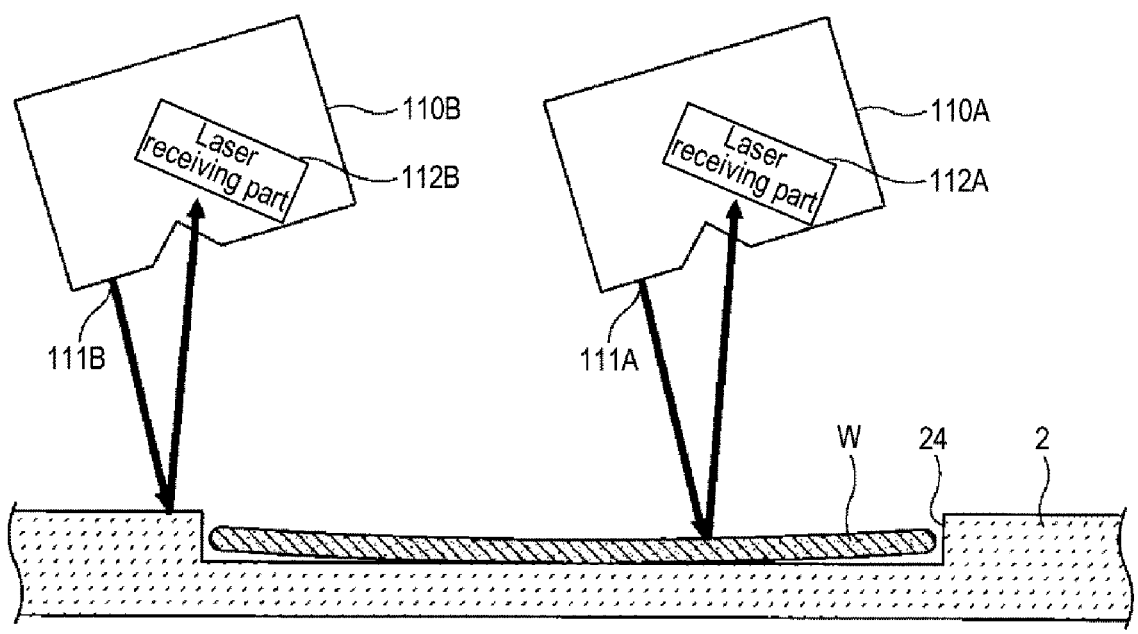
FIG. 6 is a diagram for explaining the basic principle of a substrate warping monitoring device according to a first embodiment of the present disclosure.

FIG. 6 is a view for explaining the basic principle of the substrate warping monitoring device 150 according to a first embodiment of the present disclosure. In FIG. 6, the wafer W is mounted on the recess 24, a laser is irradiated onto the wafer W from a laser irradiating part 111A of a laser displacement meter 110A located on the right side, and the laser reflected off the wafer W is received by a laser receiving part 112A. From a laser irradiating part 111B of a laser displacement meter 110B located on the left side, a laser is irradiated onto the surface of the rotary table 2 where the recess 24 is not formed, and the laser reflected off the surface of the rotary table 2 is received by a laser receiving part 112B. As long as the laser displacement meters 110A and 110B are capable of receiving the reflected laser, they can measure a distance between the respective laser displacement meter 110A and 110B and an object, namely a height of the object regardless of a material of the object. Accordingly, a height of the surface of the rotary table 2 made of quartz as well as a height of the surface of the wafer W made of a semiconductor such as silicon or the like can be accurately measured. Thus, the heights can be detected. As the laser receiving parts 112A and 112B, various light receiving elements may be used as long as they can detect the reception of a laser beam. The laser receiving parts 112A and 112B may be composed of, for example, a CMOS (Complementary Metal Oxide Semiconductor) sensor, a CCD (Charge Coupled Device) or the like.

As described above, the rotary table 2 is generally made of quartz and is substantially transparent. Therefore, the reception amount of reflected laser is smaller than an amount of the laser irradiated onto the wafer W. However, the height position can be detected irrespective of the laser reception amount. When the wafer W is separated, the wafer W is not present in the recess 24. Therefore, the height measurement value is obviously different from that when the wafer W is present. Accordingly, the separation of the wafer W can be detected based on the difference in the height measurement value. Since the position of the recess 24 can be grasped by the encoder 25, it is possible to easily detect that the wafer W is separated from which of the recesses 24.

For example, by setting the surface of the rotary table 2 as a reference surface and calculating a difference between a measurement value when the laser is irradiated on the surface of the wafer W and a measurement value when the laser is irradiated on the surface of the rotary table 2, it is possible to calculate a displacement amount of the wafer W with respect to the surface of the rotary table 2. That is to say, using the flat surface of the rotary table 2 as a reference surface, it is possible to calculate how high or low the surface of the wafer W is located with respect to the reference surface. The surface of the rotary table 2 may not be constituted as a completely horizontal flat surface in all regions due to the influence of machining accuracy, installation situation and the like, but may be a surface having a locally fine inclination (eccentricity) in many cases. Thus, if the surface of the rotary table 2 in the vicinity of the wafer W is used as a reference surface, it is possible to individually set the surface of the rotary table 2 reflecting the local inclination (eccentricity) in the vicinity of each recess 24 as a reference surface and it is possible to accurately grasp the warping amount of the wafer W on the recess 24 from the reference surface. In particular, if the surface of the rotary table 2 in the vicinity of each recess 24 is used as a reference surface and if an individual reference surface is set for each recess 24, it is possible to extremely accurately grasp the warping amount of the wafer W.

However, it is not indispensable to use the surface of the rotary table 2 in the vicinity of the recess 24 as a reference surface. Various surfaces inside and outside the chamber 1 may be used as reference surfaces. For example, a point in the plane of the wafer W or the respective point before one rotation may be used as the reference surface.

Figure 7A:
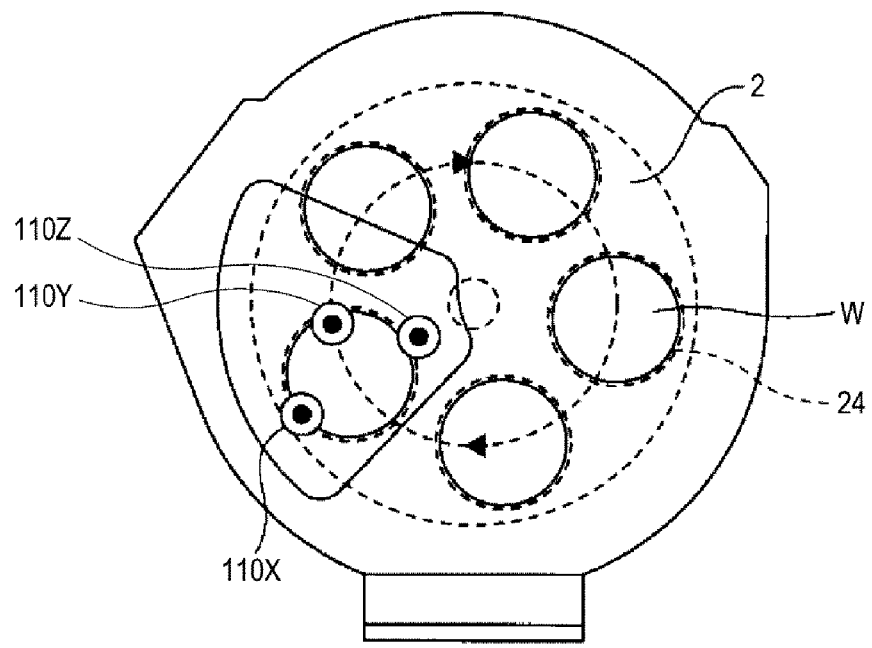
FIGS. 7A to 7C are diagrams showing an example in which a plurality of laser displacement meters is arranged.
Figure 7B:
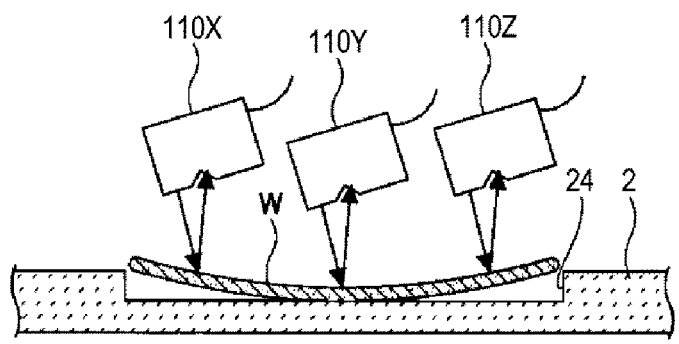
Figure 7C:
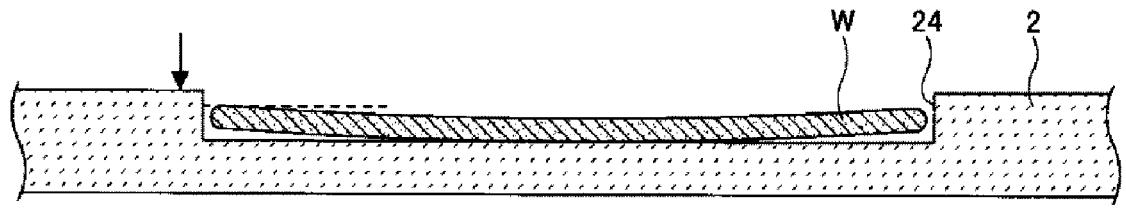

FIGS. 7A to 7C are diagrams showing an example in which a plurality of laser displacement meters is arranged. FIG. 7A is a diagram showing an example in which three laser displacement meters 110X, 110Y and 110Z are arranged. As indicated by a broken line in FIG. 7A, each of the laser displacement meters 110X, 110Y and 110Z can measure a surface profile only at a predetermined position (one point) in the radial direction of the rotary table 2. Accordingly, in order to grasp the overall surface profile of the wafer W, it is preferable to adopt a configuration in which a laser can be irradiated to a plurality of positions which have different distances from the center of the rotary table 2 and through which the wafer W passes.

In FIG. 7A, there is shown an example in which the laser displacement meters 110X, 110Y and 110Z are provided at a position through which the central portion of the wafer W passes, a position through which an inner end portion of the wafer W near the center of the rotary table 2 passes, and a position through which an outer end portion of the wafer W near the peripheral edge portion of the rotary table 2 passes, respectively. The number and arrangement positions of the laser displacement meters 110X, 110Y and 110Z may be variously changed depending on the intended use. In the case of using three laser displacement meters 110X, 110Y and 110Z, as shown in FIG. 7A, the laser displacement meters 110X, 110Y and 110Z may be arranged at the positions where the outer, central and inner surface profiles of the wafer W can be measured. For example, in a case of using five laser displacement meters, two additional laser displacement meters may be further provided at a position between the central laser displacement meter 110Y and the inner laser displacement meter 110Z and at a position between the central laser displacement meter 110Y and the outer laser displacement meter 110X, respectively. In this manner, the number and arrangement positions of the laser displacement meters may be variously changed depending on the intended use.

FIG. 7B is a side view of the laser displacement meters 110X, 110Y and 110Z in the plane extending in the radial direction in FIG. 7A. As shown in FIG. 7B, the laser displacement meters 110Y, 110Z and 110X are respectively provided at different positions corresponding to the center, inner and outer positions of the wafer W in the radial direction so as to irradiate laser onto the wafer W from above. With such a configuration, even if the center side of the wafer W is not warped upward and only the inner side and the outer side of the wafer W are warped upward, the warping at both ends can be monitored by the laser displacement meters 110Z and 110X provided on the center side and the outer side.

FIG. 7C is a diagram for explaining a range in which the wafer W can be monitored. Since the laser displacement meters 110X, 110Y and 110Z can irradiate the laser from above the rotary table 2 and the wafer W and can measure the distances between the respective laser displacement meters 110X, 110Y and 110Z and the object to be irradiated, it is possible to monitor a state in which the wafer W is contained in the recess 24 but warping is occurring, namely the warping state of the wafer W in the recess 24. In a configuration in which a laser is irradiated from a lateral side, warping may not be monitored unless the warping amount of the wafer W is equal to or greater than the depth of the recess 24 and unless a portion of the wafer W is higher than the surface of the rotary table 2. However, in the substrate warping monitoring device 150 according to the present embodiment, the surface profile is measured by irradiating a laser from above the wafer W. Therefore, it is also possible to monitor the state in which the wafer W is warped inside the recess 24.

Figure 8:
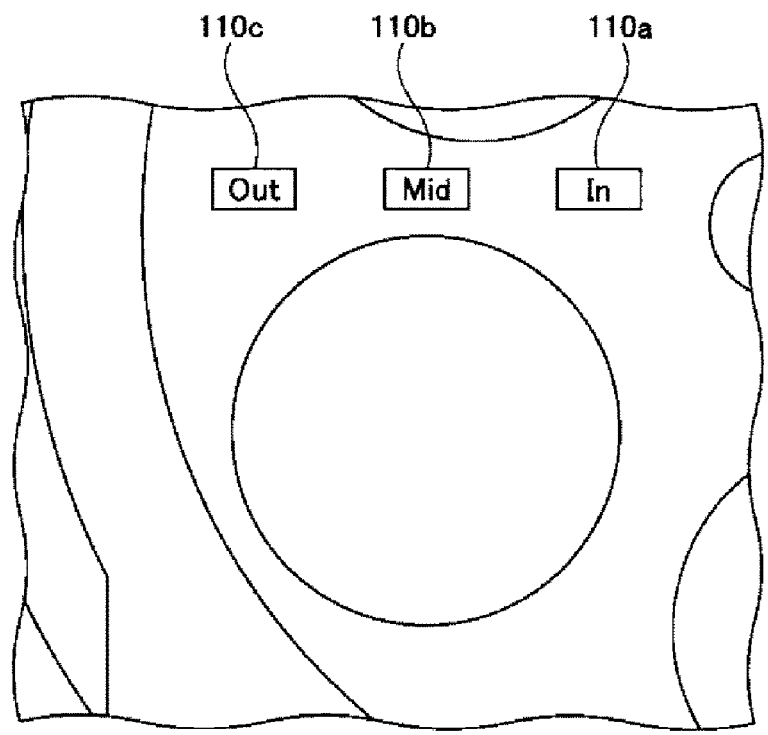
FIG. 8 is a view for explaining measurement of a reference surface in an example of a substrate warping monitoring device and a substrate warping monitoring method according to an embodiment of the present embodiment.

FIG. 8 is a diagram for explaining measurement of a reference surface in an example of the substrate warping monitoring device 150 and the substrate warping monitoring method according to the present embodiment. In FIG. 8, there is shown an example in which three laser displacement meters 110a, 110b and 110c are provided at the inner side, the middle side and the outer side of the rotary table 2, respectively. In this way, the plurality of laser displacement meters 110a, 110b and 110c may be arranged in a line along the radial direction of the rotary table 2.

In FIG. 8, it is assumed that the reference surface is set on the surface of the rotary table 2. Each of the laser displacement meters 110a to 110c irradiates a laser onto the upper surface of the rotary table 2 in the state of FIG. 8 and receives the laser reflected off the upper surface to acquire a measurement value. As a result, the three laser displacement meters 110a to 110c respectively acquire reference values. Such measurement of reference values may be performed after mounting the wafers W in the plurality of recesses 24 as described above.

Figure 9:
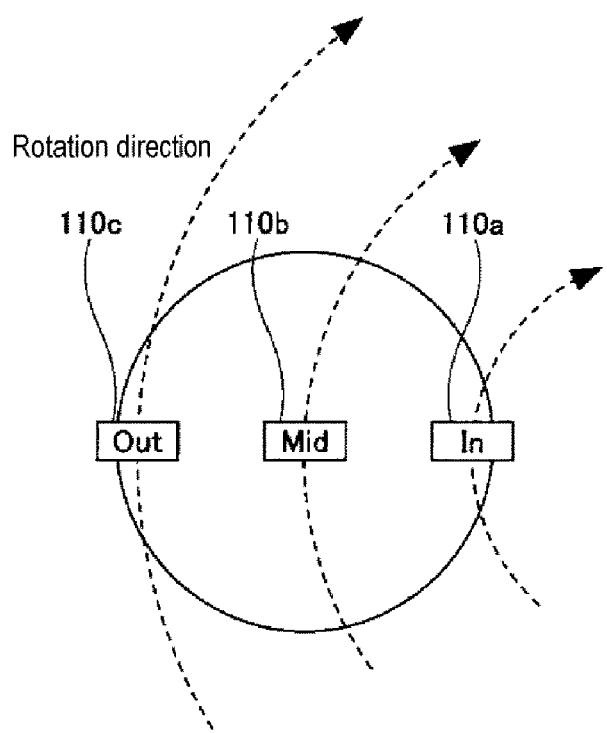
FIG. 9 is a view showing a state in which three laser displacement meters are capable of irradiating a laser beam onto a surface of a wafer.

FIG. 9 is a diagram showing a state in which, with the rotation of the rotary table 2, the wafer W is moved directly under the three laser displacement meters 110a to 110c so that the three laser displacement meters 110a to 110c can irradiate a laser onto the surface of the wafer W. In this state, the laser displacement meters 110a to 110c can irradiate a laser onto the surface of the wafer W and can measure the surface profile of the wafer W. As indicated by a broken line in FIG. 9, Lengths over which the three laser displacement meters 110a to 110c can irradiate the laser onto the wafer W are different from each other depending on the respective positions. That is to say, the middle laser displacement meter 110b can acquire the surface profile of the wafer W over the longest trajectory (distance) passing through the center of the surface of the wafer W. Further, the inner laser displacement meter 110a measures the surface profile of the wafer W over only the shortest distance in terms of distance. The outer laser displacement meter 110c measures the surface profile of the wafer W over the distance which is longer than that of the inner laser displacement meter 110a and shorter than that of the middle laser displacement meter 110b.

Figure 10A:
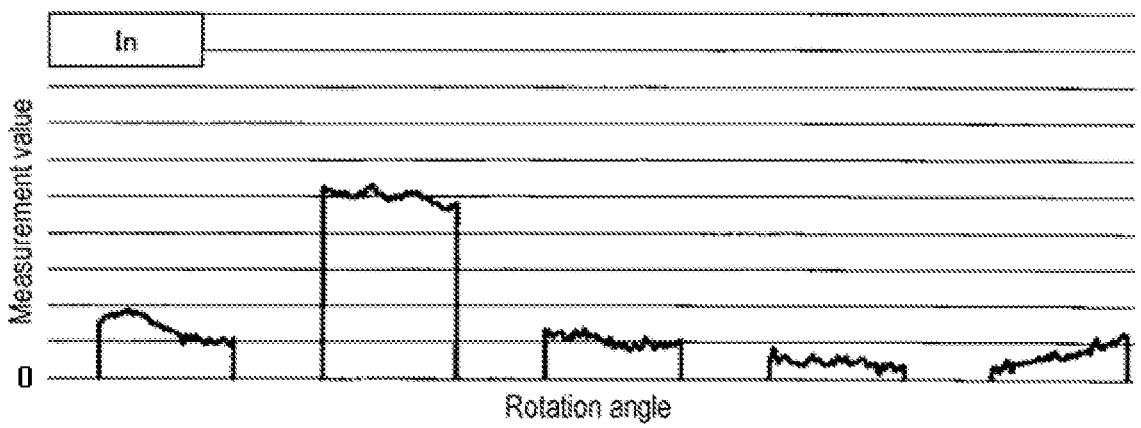
FIGS. 10A to 10C are diagrams showing an example of a surface profile of a wafer W, which is measured using the three laser displacement meters shown in FIGS. 8 and 9.
Figure 10B:
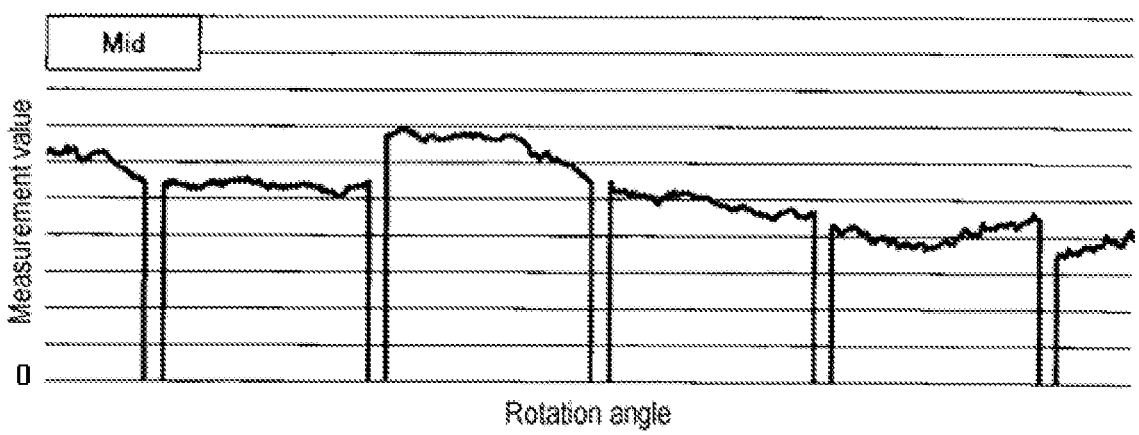
Figure 10C:
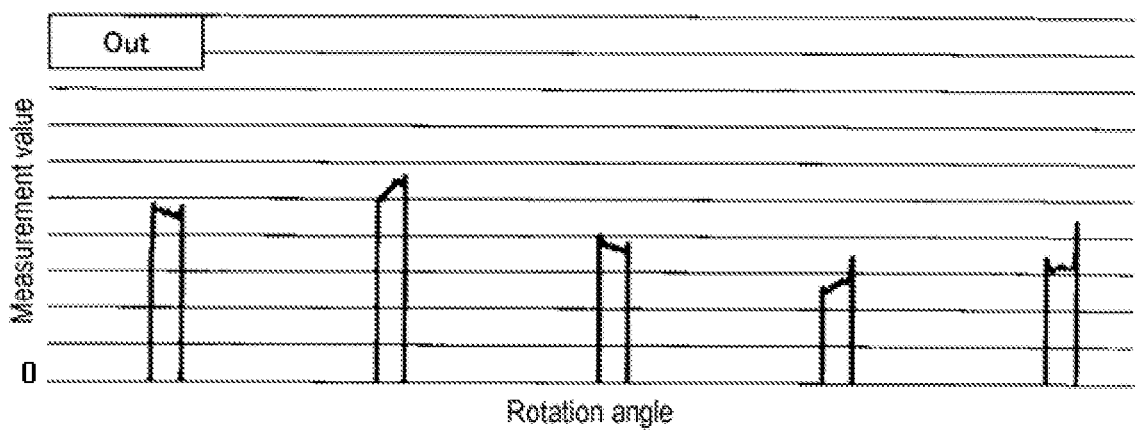

FIGS. 10A to 10C are diagrams showing an example of the surface profile of the wafer W measured using the three laser displacement meters 110a to 110c shown in FIGS. 8 and 9. FIGS. 10A, 10B and 10C correspond to the surface profiles measured by the laser displacement meters 110a, 110b and 110c, respectively.

In FIGS. 10A, 10B and 10C, the surface of the rotary table 2 is set to a reference surface, and the measurement value of the laser reflected off the surface of the rotary table 2 is set to fall outside the detection range. That is to say, there is shown the measurement value in a state in which the measurement value of the reference surface is already taken into account. Accordingly, in FIGS. 10A to 10C, points where positive measurement values are indicated show regions in which the surface profile of the wafer W is measured, whereas points where the measurement value is zero show regions in which the laser was irradiated onto the rotary table 2.

In FIGS. 10A to 10C, the horizontal axis represents the rotation angle and the vertical axis represents the measurement value. The rotation angle is smaller in the measurement result of the outer laser displacement meter 110c having a long measurement distance as shown in FIG. 10C than in the measurement result of the inner laser displacement meter 110a having a short measurement distance as shown in FIG. 10A. This is because a sampling cycle of measurement is synchronized with the rotation angle and because the rotation angle defined as a measurement range is smaller at the outer side of the wafer W than at the inner side of the wafer W. However, when monitoring the warping of the wafer W, the fact that the rotation angle at the outer position of the wafer W is small does not matter. The acquired data amount is sufficient, and the warping of the wafer W can be sufficiently monitored.

Even when the rotation speed of the rotary table 2 becomes high, the number of monitoring points can be arbitrarily changed by changing the sampling cycle. It is therefore possible to sufficiently cope with the increase in the rotation speed of the rotary table 2.

Figure 11:
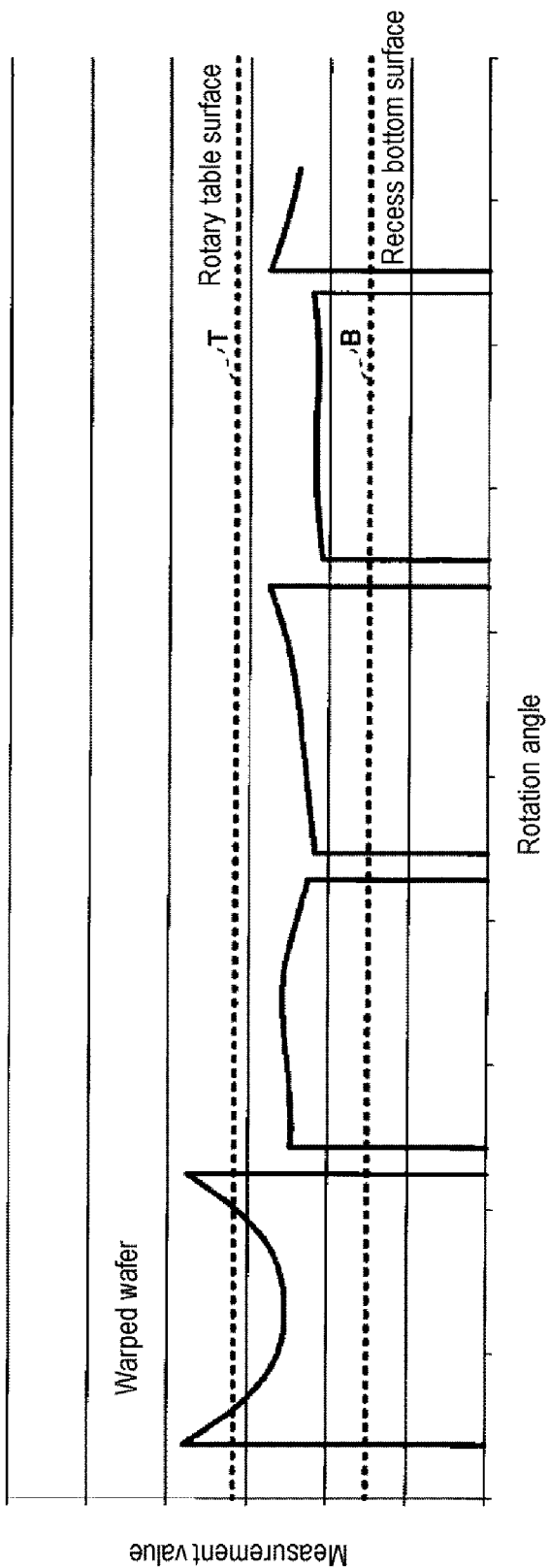
FIG. 11 is a diagram for explaining a measurement value of a surface profile in a case where warping occurs in a wafer W in a circumferential direction.

FIG. 11 is a diagram for explaining the measurement value of the surface profile in the case where the wafer W is warped in the circumferential direction. A waveform of the measurement value shown at the leftmost side in FIG. 11 is a diagram showing the measurement value obtained by the laser displacement meter 110b when warping occurs in the wafer W along the circumferential direction. The measurement value of the laser displacement meter 110b indicates the surface profile obtained at the middle position of the wafer W. Therefore, as shown in FIG. 11, when a warped waveform is measured, the warping also occurs in the surface of the wafer W. In the example of FIG. 11, both end portions of the wafer W along the circumferential direction of the rotary table 2 are warped upward.

Further, in FIG. 11, the measurement value corresponding to the bottom surface of the recess 24 and the measurement value corresponding to the height of the upper surface of the recess 24 (the flat upper surface of the rotary table 2) are indicated by broken lines B and T, respectively. In the example of FIG. 11, the leftmost measurement value is higher than that of the upper surface of the recess 24, which means that a large warping is generated in the wafer W. When such a waveform of the measurement value is detected, it is preferable to quickly decelerate or stop the rotation of the rotary table 2.

All other measurement values are lower than the measurement value T of the upper surface of the recess 24, which means that no large warping is generated in the wafer W. In the case of such a waveform, the rotation of the rotary table 2 may be continued as it is and the substrate processing may be continued.

Figure 12:
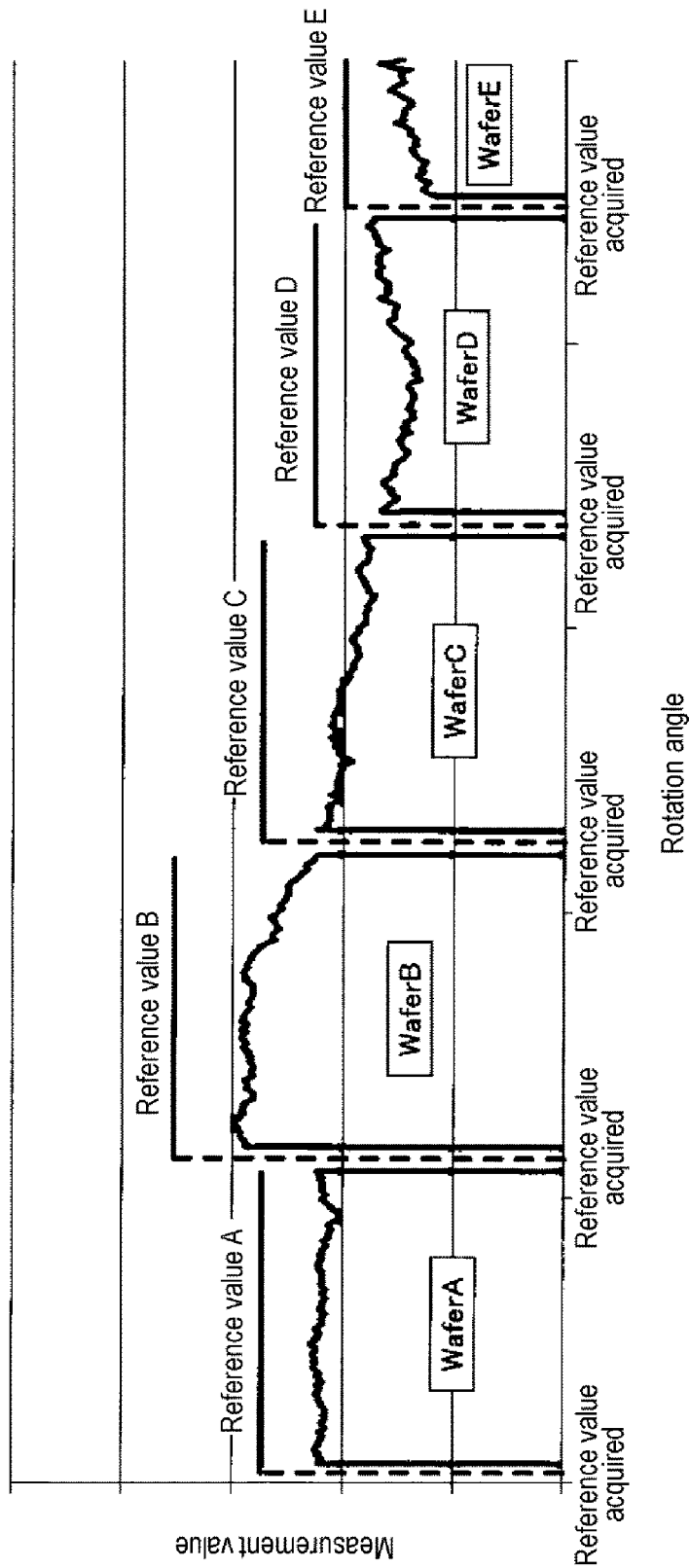
FIG. 12 is a diagram for explaining a process of calculating a warping amount of a wafer W using a reference value.

FIG. 12 is a diagram for explaining a process of calculating the warping amount of the wafer W using a reference value. In FIG. 12, there are shown the measurement values of the surface profiles of the wafers A to E. In the wafers A to E, absolute values of the measurement values are measurement values with variations. However, reference values A to E are respectively set as the reference values, and all the reference values A to E are set with different measurement values. As described above, when the surface of the rotary table 2 is set as the reference value, with the rotation of the rotary table 2, the laser is necessarily irradiated onto the upper surface of the rotary table 2 between the adjacent recesses 24 before the laser is irradiated on the wafer W. Therefore, at that timing, the reference surface can be updated as needed, and the warping of the wafer W can be monitored while correcting the eccentricity or the like of the rotary table 2. In the case where the rotary table 2 is made of quartz, as described in FIG. 6, the laser transmits the rotary table 2 so that the measurement value becomes a very small value.

As shown in FIG. 12, the reference values A to E are height measurement values differing for each of the wafers A to E. Even in such a case, by respectively calculating differences between the measurement values of the wafers A to E and the reference values A to E, it is possible to accurately calculate the respective warping amounts of the wafers A to E. In FIG. 12, the absolute values of the measurement values of the wafers A to E have variations. Since the reference values A to E also have a variation tendency similar to those of the wafers A to E, by respectively calculating the differences between the measurement values of the wafers A to E and the reference values A to E, it is possible to calculate the warping amounts having a uniform measurement value as a whole.

As described above, in the substrate warping monitoring device 150 and the substrate warping monitoring method according to the present embodiment, the surface profile of the wafer W can be measured in real time and the reference value necessary for calculating the warping amount can be updated in real time. Therefore, the warping amount can be accurately calculated by reflecting the eccentricity of the rotary table 2, the difference in local inclination and the like. In this regard, the calculated warping amount does not necessarily have to be an accurate value of the warping amount but may be a relative measurement value on the basis of the reference value, which makes it possible to determine the necessity of deceleration or termination of the rotation of the rotary table 2.

The surface profile of the wafer W needs to be measured in real time. However, the reference value used for calculation of the warping amount need not always be measured in real time. For example, before rotating the rotary table 2, a laser may be irradiated on the reference surface of the rotary table 2 or the like to acquire a reference value in advance. The reference value may be stored in the memory part 130. The warping amount of the wafer W may be calculated in real time using the stored reference value. The eccentricity of the rotary table 2 does not change over time.

Therefore, the height of the rotary table 2 in the vicinity of each of the recesses 24 is measured. The height itself does not change greatly with the lapse of time. Even in the case where, instead of the surface of the rotary table 2, a predetermined position in the plane of the wafer W is used as a reference surface, by initially measuring the height of the wafer W mounted in each recess 24 in a state in which the wafer W is not warped, and storing the same in the memory part 130, it is possible to calculate the warping amount of the wafer W in the same manner as in the case where the surface of the rotary table 2 is used as the reference surface.

That is to say, once the height position of the reference surface is acquired in consideration of the eccentricity of the rotary table 2 or the like, by subsequently acquiring the height of the wafer W in real time, it is possible to accurately acquire the warping amount of the wafer W in real time. As long as the reference surface can be set in consideration of such a difference in the height of each recess 24, the reference surface may be surface other than the surface of the rotary table 2 or the wafer W.

Conversely, in a case of updating the reference value indicating the height of the reference surface in real time, the height of a predetermined reference surface may be measured in real time, and the reference value stored in the memory part 130 may be updated in real time.

As described above, in the substrate warping monitoring device 150 and the substrate warping monitoring method according to the present embodiment, it is possible to flexibly set the reference surface depending on the intended use and to measure the warping amount of the wafer W in real time.

Further, in the substrate warping monitoring device 150 and the substrate warping monitoring method according to the present embodiment, it is possible to constantly monitor the warping amount of the wafer W using the latest data. Therefore, it is possible to accumulate data by monitoring the change in the surface profile and warping amount of the wafer W over time. From the trend of the change in the surface profile and warping amount of the wafer W, it is possible to predict a timing at which the warping amount of the wafer W exceeds a predetermined allowable value (threshold value).

Further, as described above, various surfaces may be set as the reference surface depending on the intended use, and the reference surface is not limited to the surface of the rotary table 2. Therefore, the substrate warping monitoring device 150 and the substrate warping monitoring method according to the present embodiment may be applied to various substrate processing apparatuses.

Figure 13A:
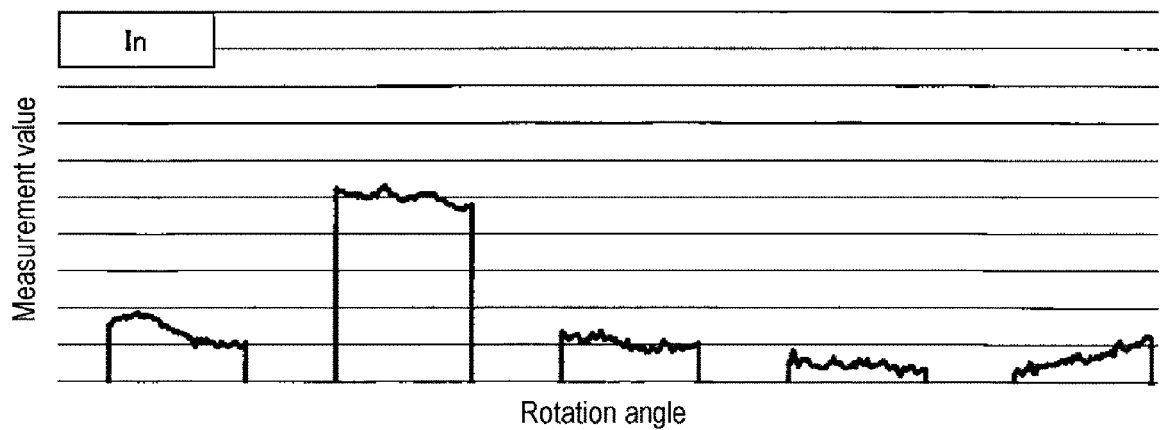
FIGS. 13A to 13C are diagrams showing an actual measurement example of a measurement value of a more detailed surface profile when three laser displacement meters are used.
Figure 13B:
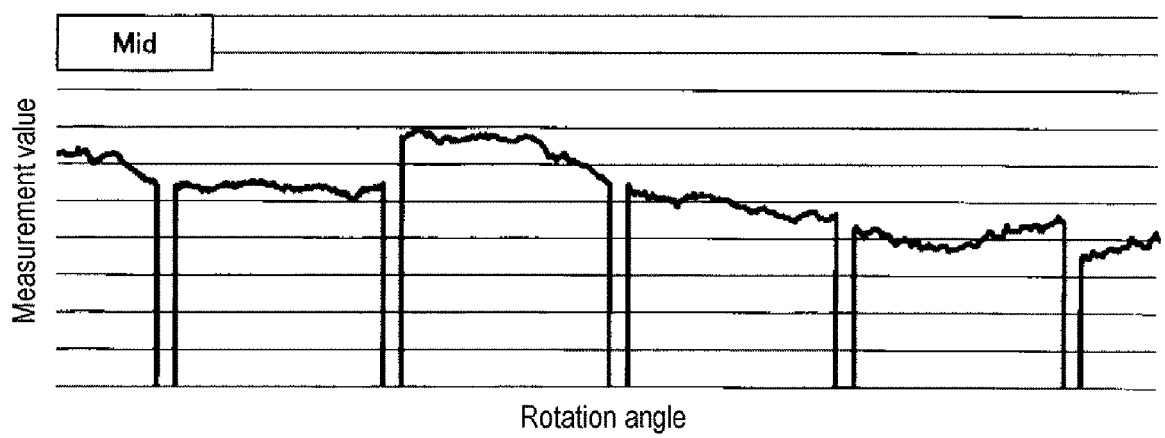
Figure 13C:
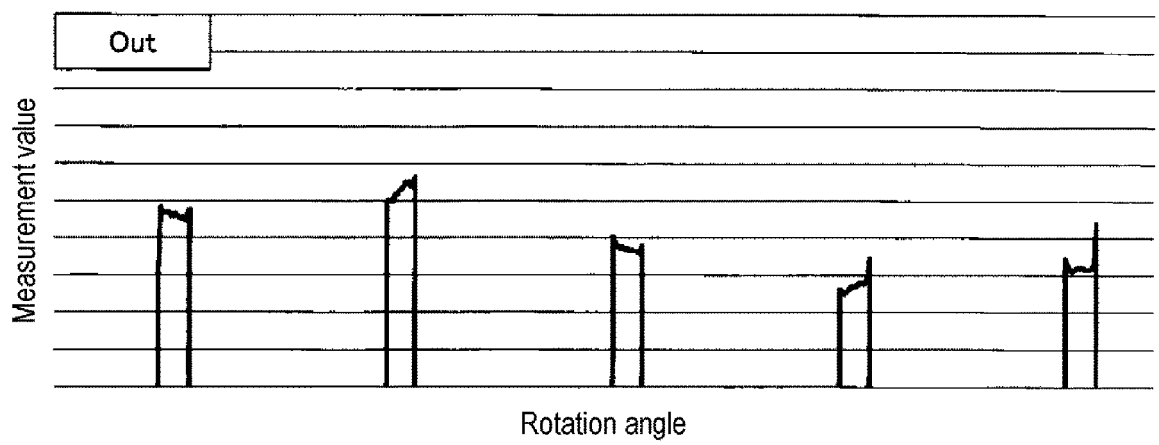

FIGS. 13A to 13C are diagrams showing a more detailed actual measurement example of the measurement value of the surface profile in the case of using three laser displacement meters. FIGS. 13A, 13B and 13C respectively correspond to the measurement values of the laser displacement meters 110*a*, 110*b* and 110*c* shown in FIGS. 8 and 9. These actual measurement values are values measured by setting the temperature of the heater unit 7 at 620 degrees C., the internal pressure of the chamber 1 at 8.0 Torr, and the rotation speed of the rotary table 2 at 180 rpm, which are process conditions of high temperature, high pressure and high rotation speed.

In FIGS. 13A, 13B and 13C, the horizontal axis indicates the rotation angle and the vertical axis indicates the measurement value. As described with reference to FIGS. 10A, 10B and 10C, regarding the detected rotation angles, the rotation angle of the middle laser displacement meter 110*b* is the largest, the rotation angle of the inner laser displacement meter 100*a* is the next largest, and the rotation angle of the outer laser displacement meter 100*c* is the smallest.

Among them, the measurement results shown in FIG. 13B and FIG. 13A will be described in more detail.

Figure 14:
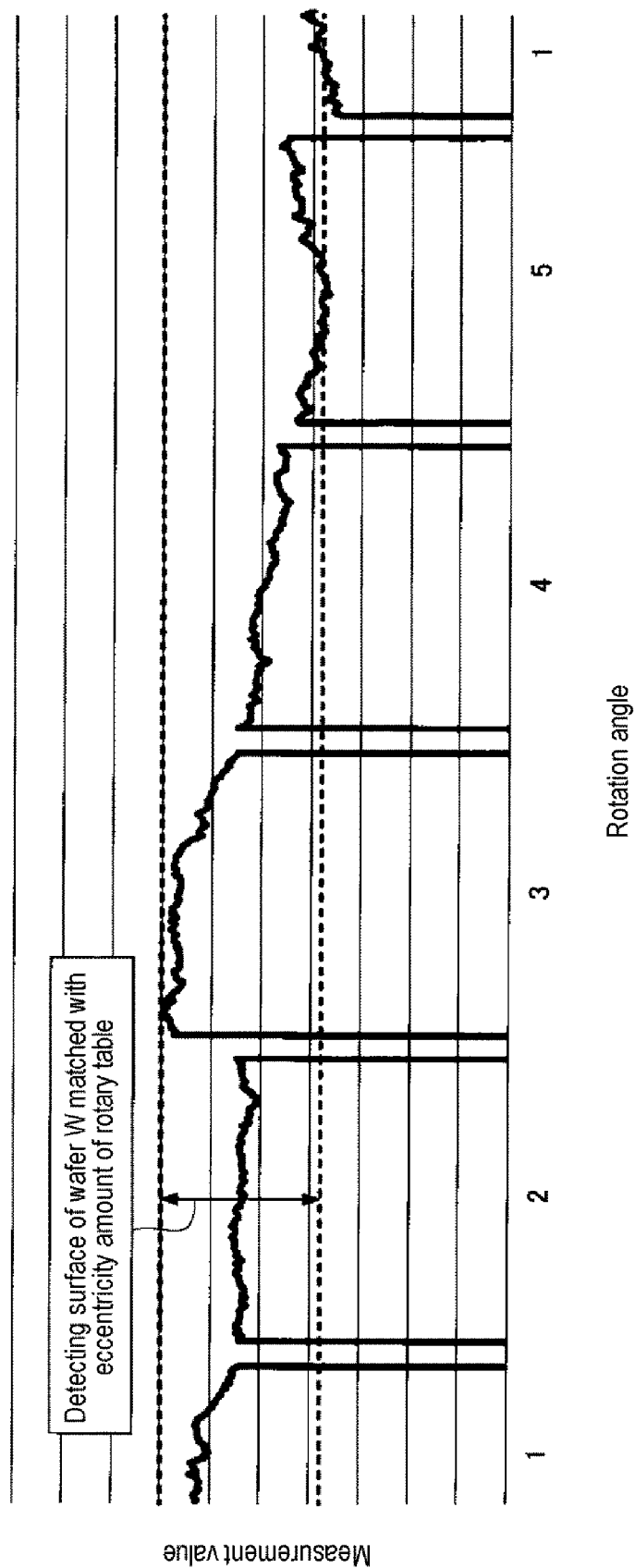
FIG. 14 is an enlarged view of the measurement result of FIG. 13B.

FIG. 14 is an enlarged view of the measurement result shown in FIG. 13A. In FIG. 14, five recesses 24 are denoted by reference numerals 1 to 5. The tendency thereof will be described. As shown in FIG. 14, among the measurement values of the first to fifth recesses 24, the measurement values of the first to third recesses 24 are relatively high and the measurement values of the fourth and fifth recesses 24 are relatively low. This is presumably due to the influence of the inclination (eccentricity) of the rotary table 2. As shown in FIG. 14, the lowest measurement value of the fifth recess 24 and the highest measurement value of the third recess 24 show a difference in measurement value near 3 scales. In such a case, by measuring the surface profile of the wafer W in conformity with the amount of eccentricity of the rotary table 2, it is possible to accurately calculate the warping amount as a uniform value as a whole. For example, high reference values respectively corresponding to the first to third recesses 24 are set with respect to the first to third recesses 24 having high measurement values. Low reference values respectively corresponding to the fourth and fifth recesses 24 are set with respect to the fourth and fifth recesses 24 having low measurement values. By respectively calculating the differences between the high reference values and the low reference values, it is possible to accurately calculate warping amounts although they are relative values.

For example, when the measurement value of the surface of the rotary table 2 is cut so as not to be reflected as a measurement value, such a reference value may be newly set. Even in such a case, by reflecting a local difference in the measurement value of the surface of the rotary table 2 in the reference value, a more effective reference value can be set in each of the first to fifth recesses 24 while using the surface of the rotary table 2 as a reference surface.

FIG. 15 is an enlarged view of the measurement result shown in FIG. 13A. In FIG. 15, five recesses 24 are denoted by reference numerals 1 to 5. A method of cutting a noise of a measurement value will be described.

In FIG. 15, there are shown measurement values acquired by the laser displacement meter 100*a* with respect to the first to fifth recesses 24. A warping of the wafer W is detected in the fifth recess 24. On the other hand, in the fourth recess 24, the measurement value itself is relatively low. However, a noise is generated at the start of the measurement. An instantaneous measurement value having a magnitude close to the measurement value of the first recess 24 is observed. The noise in the fourth recess 24 is a noise generated when a laser is irradiated on the edge of the wafer W.

Figure 16A:
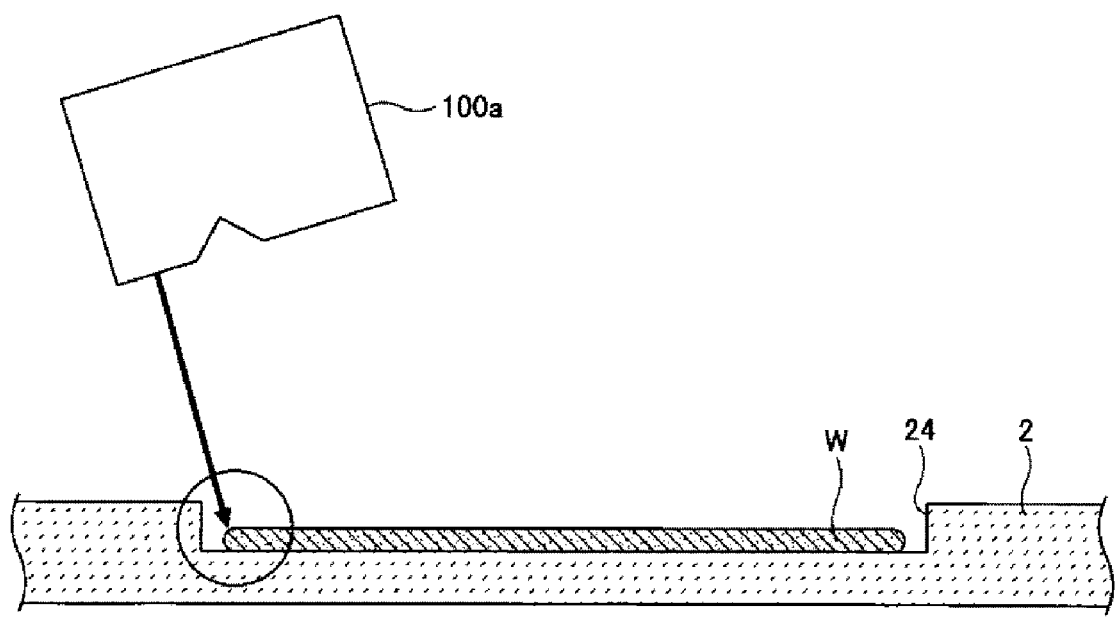
FIGS. 16A and 16B are diagrams for explaining a cause of occurrence of a noise in a surface profile measurement.
Figure 16B:
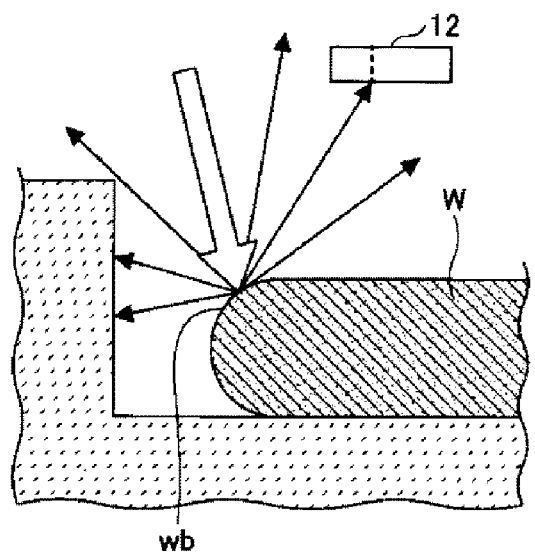

FIGS. 16A and 16B are diagrams for explaining a cause of noise generation in a surface profile measurement. As shown in FIG. 16A, a noise is generated when a laser is irradiated onto the edge portion of the wafer W from the laser displacement meter 100*a*.

FIG. 16B is an enlarged view of the edge portion of the wafer W shown in FIG. 16A. As shown in FIG. 16B, a beveled portion Wb is formed at the edge of the wafer W. Since the beveled portion Wb has a rounded surface shape, the laser irradiated onto the beveled portion Wb is diffusely reflected. Such reflected lasers may be received by pixels of a CMOS corresponding to positions different from the actual height, and the reflected laser corresponding to the position higher than the actual height may be detected. In principle, the bevel portion Wb is formed at the edge portions of all the wafers W. Therefore, when such a noise occurs, there is a possibility that the accurate calculation of the warping amount of the wafer W may be hindered.

Figure 17A:
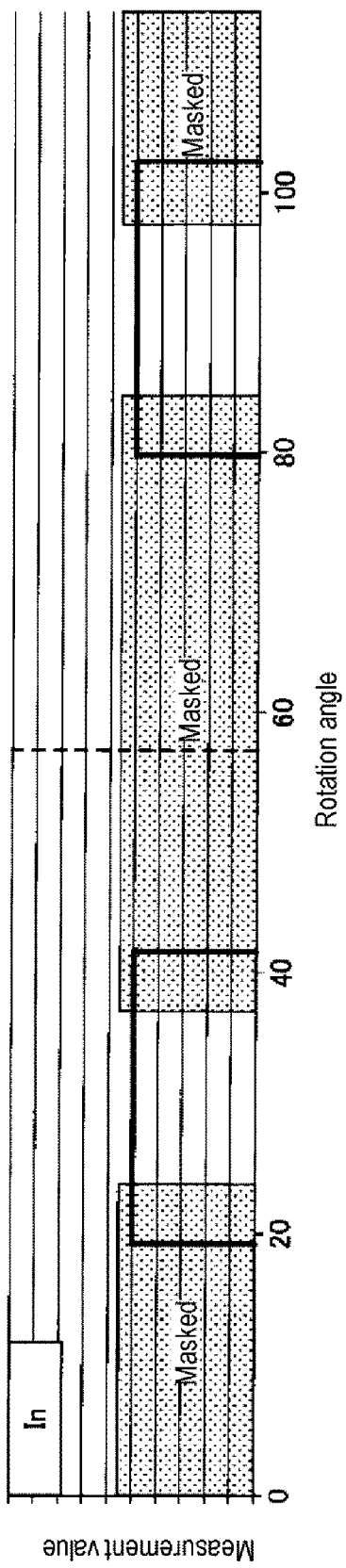
Figure 17B:
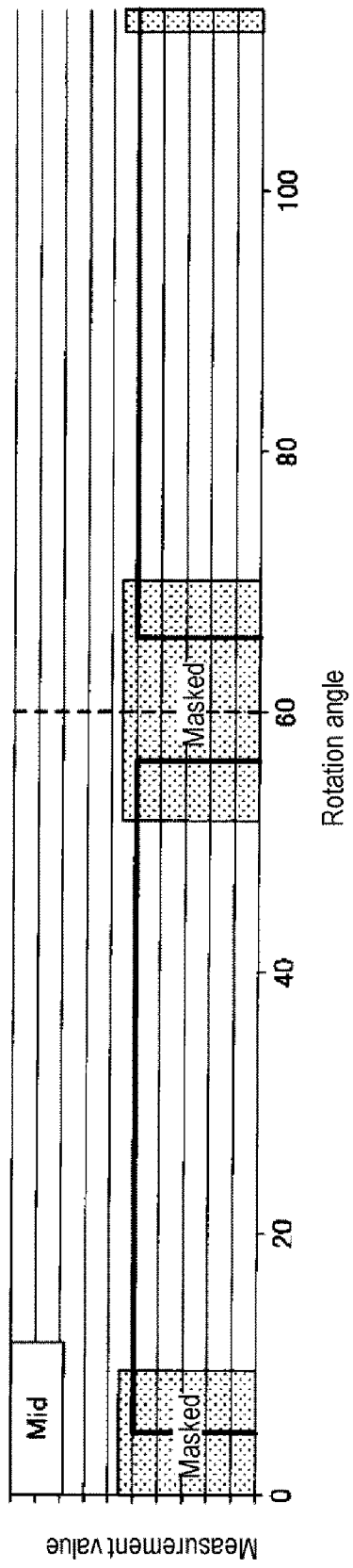

FIGS. 17A, 17B and 17C are diagrams showing an example of a method for removing the noise explained with reference to FIGS. 15, 16A and 16B. In FIGS. 17A, 17B and 17C, the horizontal axis indicates the rotation angle and the vertical axis indicates the presence or absence of the measurement value. FIGS. 17A, 17B and 17C respectively correspond to the measurement values of the laser displacement meters 110a, 110b and 110c shown in FIGS. 8 and 9.

As shown in FIGS. 17A, 17B and 17C, when measuring the surface profile of the wafer W, the measurement value corresponding to the edge portion of the wafer W is masked so as not to be recorded. In other words, the measurement value corresponding to the edge portion of the wafer W is discarded so that it is not used as measurement value data of the surface profile. Such a discard process may be performed in the calculation part 120 and can be easily performed because the measurement value is merely excluded without being adopted as a record. Accordingly, the data of the surface profile to be recorded is only the highly reliable data from which the noise has been removed. Therefore, it is possible to appropriately grasp and record the surface profile of the wafer W.

Figure 18:
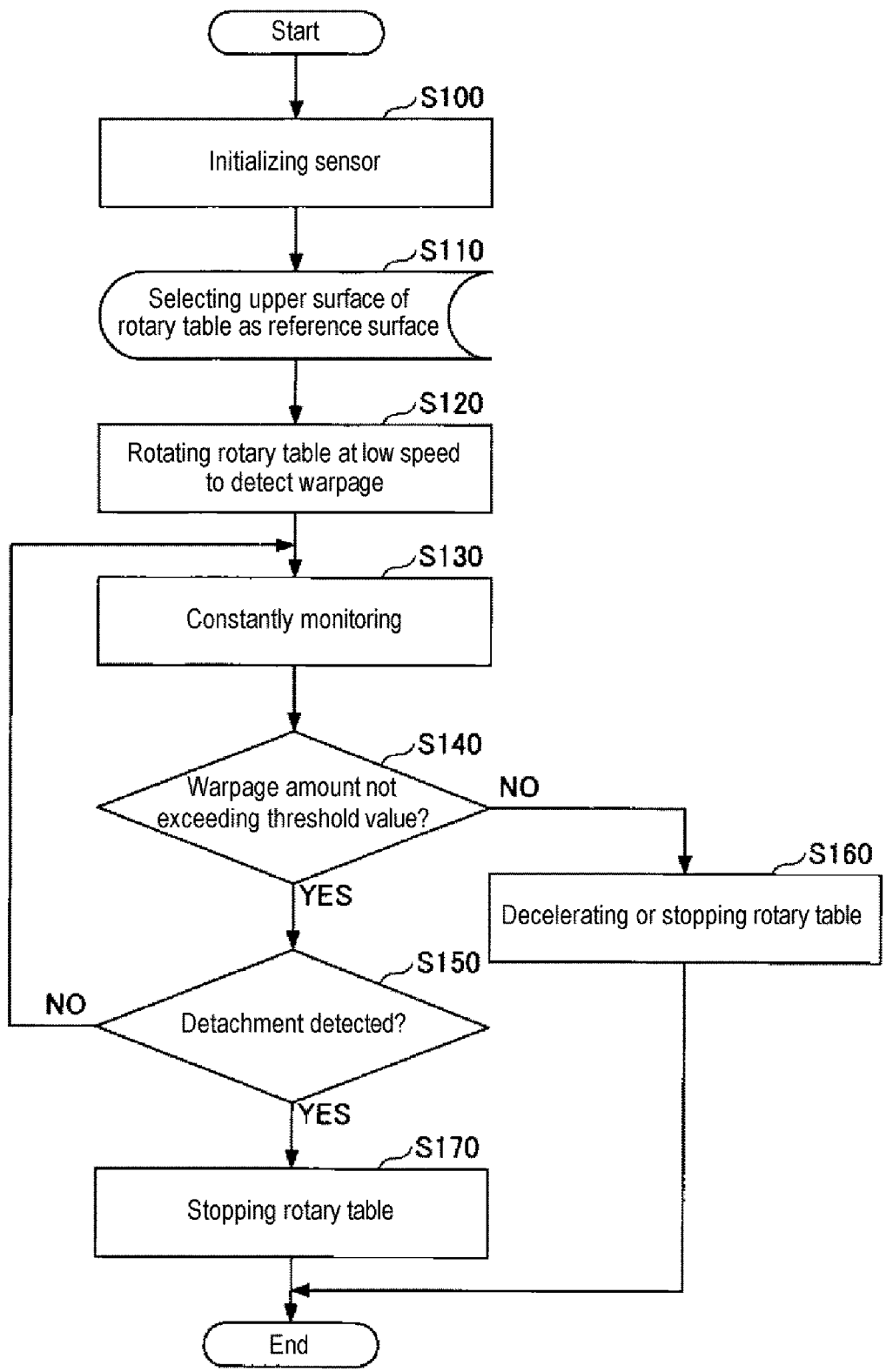
FIG. 18 is a diagram for explaining a process flow of a substrate warping monitoring method according to a first embodiment of the present disclosure.

FIG. 18 is a view for explaining a process flow of the substrate warping monitoring method according to the first embodiment of the present disclosure. The constituent elements described so far are designated by the same reference numerals, and the description thereof is omitted. In addition, a case where three laser displacement meters 100a to 100c are used will be described as an example.

In step S100, the laser displacement meters 100a to 100c are initialized. Calibration and the like may be performed with respect to the laser displacement meters 100a to 100c as necessary.

In step S110, the upper surface of the rotary table 2 is selected as a reference surface, and the surface of the rotary table 2 is irradiated with a laser to obtain a measurement value. Specifically, the state shown in FIG. 8 is established, the surface of the rotary table 2 between the adjacent recesses 24 is irradiated with the laser, and measurement is performed. The measurement value thus obtained is stored in the memory part 130 as a reference value.

In step S120, the rotary table 2 is intermittently rotated at a low speed. In each recess 24, detection is performed as to whether or not warping of the wafer W is controlled. The interior of the chamber 1 is at a high temperature. Therefore, when the wafer W is loaded into the chamber 1 and mounted on the recess 24, warping may occur in the wafer W in many cases. Warping detection at an initial stage is performed in step S120. If the warping of each wafer W is controlled and the rotary table 2 is ready to be rotated, step S120 is ended.

In any of steps S110 and S120 or before and after steps S110 and S120, preparations necessary for substrate processing, such as the evacuation of the chamber 1, the heating by the heater unit 7, the supply of the separation gas, the supply of the reaction gas and the like, are also performed according to the contents of the substrate processing.

In step S130, the rotation of the rotary table 2 is started, and the warping of the wafer W is constantly monitored. Specifically, the surface profile of the wafer W at each position is continuously measured by the laser displacement meters 110a to 110c. At that time, using the measurement value of the reference surface acquired in step S110 as a reference value, the warping amount is calculated as necessary. In addition, if necessary, the edge portion of the wafer W is masked to delete the surface profile corresponding to the edge portion from the surface profile data.

In step S140, it is determined whether or not the calculated warping amount exceeds a predetermined threshold value. Such determination is made by the calculation part 120. The threshold value is set to such a level at which when the warping amount exceeds the threshold value, the possibility of separation comes out but such separation does not occur as yet. This makes it possible to prevent occurrence of separation. Furthermore, such determination is made for all of the plurality of wafers W. When the warping amount exceeds the threshold value even in one of the plurality of wafers W, it is determined that the warping amount has exceeded the threshold value. If the calculated warping amount exceeds the threshold value, the process proceeds to step S160. The wafer W whose warping amount exceeds the threshold value is specified by the encoder 25.

In step S160, the rotation of the rotary table 2 is decelerated or stopped. When the warping amount exceeds the predetermined threshold value, there is a possibility that the wafer W is separated from the recess 24. Therefore, the rotation of the rotary table 2 is decelerated or stopped. Whether to decelerate or stop the rotation of the rotary table 2 may be determined by setting the threshold value in two levels in step S140 or by comprehensively determining other factors.

After step S160 is executed, the process flow is terminated. Thereafter, the wafer W is unloaded from the chamber 1, and a subsequent process such as continuing the processing of another lot, finding out the cause, or the like is performed.

In step S140, if it is determined that the calculated warping amount of the wafer W does not exceed the threshold value, the process proceeds to step S150.

In step S150, it is determined whether the separation of the wafer W is detected. The determination of the separation of the wafer W is performed based on whether or not the wafer W is not present in the recess 24 and the rotary table 2 is exposed. Such an exposure corresponds to a state in which, when the rotary table 2 is made of quartz, the measurement value of the laser obtained from the recess 24 is a very small value. Such determination is made by the calculation part 120. In step S150, if the separation of the wafer W from the recess 24 is detected, the process proceeds to step S170.

In step S170, the rotation of the rotary table 2 is stopped. In the case of the separation, instead of decelerating the rotary table 2, the rotary table 2 is promptly stopped so that damage to the interior of the chamber 1 and the wafer W is minimized.

After step S170 is executed, the process flow is ended and necessary measures such as checking damage to the chamber 1 and the wafer W or the like are taken.

In step S150, if the separation of the wafer W is not detected, the process returns to step S130 where the constant monitoring is continued. Similarly, the process flow of steps S130, S140 and S150 is continuously repeated.

The sequence of steps S130 to S150 is performed in parallel with the substrate processing. The deceleration or termination of the rotation of the rotary table 2 performed in steps S160 and S170 means the termination of the substrate processing.

As described above, according to the substrate warping monitoring method of the present embodiment, it is possible to cope with the situation where the possibility of separation of the wafer W is high. This makes it possible to effectively prevent occurrence of separation of the wafer W.

Figure 19:
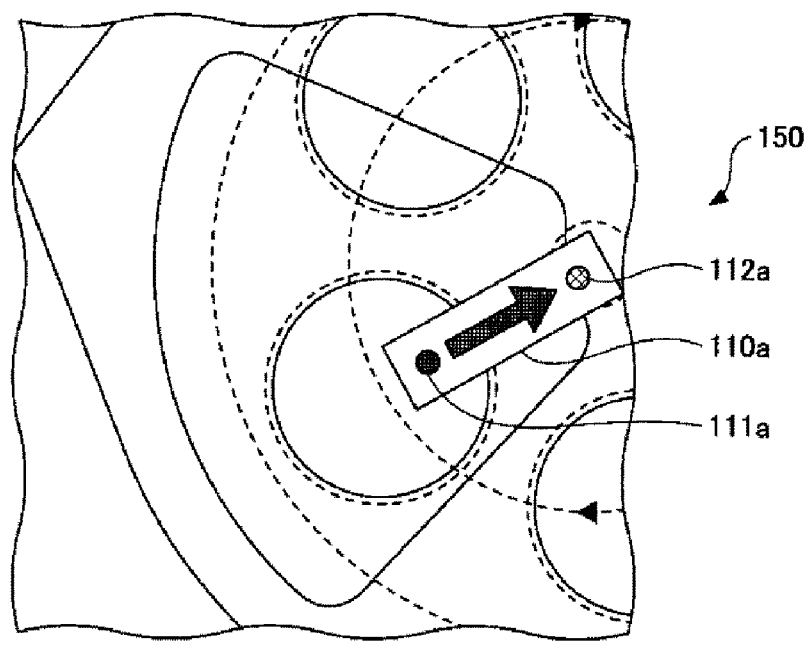
FIG. 19 is a view for explaining the orientation of a laser displacement meter of a substrate warping monitoring device according to a first embodiment.

FIG. 19 is a diagram for explaining the orientation of the laser displacement meters 110 and 110a to 110c of the substrate warping monitoring device 150 according to the first embodiment. As shown in FIG. 19, in the first embodiment, installation angles of laser heads 111a and 112a of each of the laser displacement meters 110 and 110a to 110c are set such that a laser beam is projected and received from the outside to the interior of the rotary table 2. This makes it possible to prevent the influence of noise and to measure the surface profile up to the edge portion of the wafer W.

Second Embodiment

Figure 20:
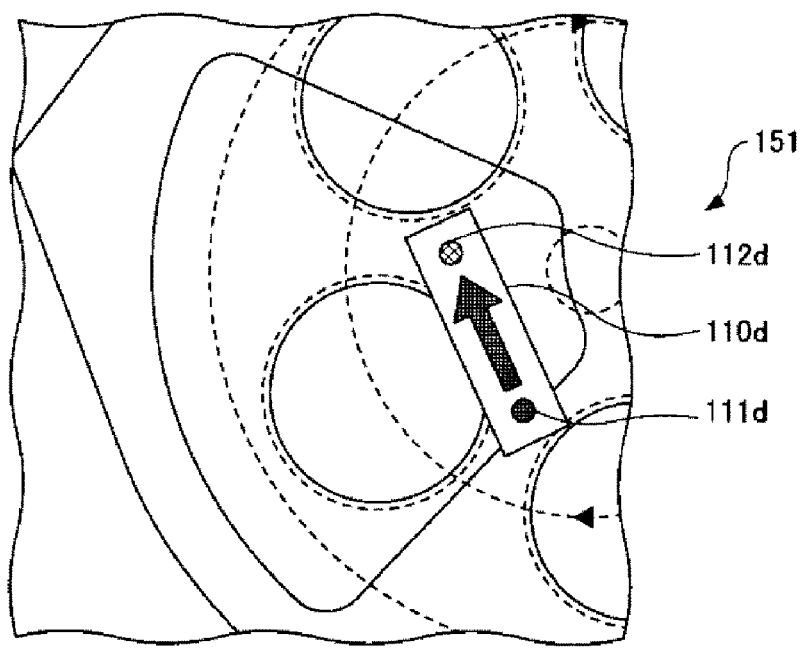
FIG. 20 is a view showing an example of a substrate warping monitoring device according to a second embodiment.

FIG. 20 is a view showing an example of a substrate warping monitoring device 151 according to a second embodiment of the present disclosure. In the substrate warping monitoring device 151 according to the second embodiment, a laser displacement meter 110d is disposed along the rotational direction of the rotary table 2 such that installation angles of laser heads 111d and 112d fall within ±10 degrees from the rotational direction. This makes it possible to suppress diffusive reflection of a laser beam in the beveled portion Wb of the wafer W and to receive a stable reflected laser beam.

Other constituent elements and a substrate warping monitoring method according to the second embodiment are the same as those of the first embodiment. Thus, the description thereof is omitted.

According to the present disclosure in some embodiments, it is possible to monitor a warping amount of a substrate and to predict separation of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate warping monitoring device for monitoring a warping of a substrate mounted in a substrate mounting region formed in a rotary table along a circumferential direction during rotation of the rotary table, comprising:
an optical displacement meter located above the rotary table and configured to irradiate a light to a predetermined position on the rotary table, receive a reflected light reflected off the rotary table and the substrate which passes through the predetermined position, measure a distance between the optical displacement meter and the substrate using the reflected light, and measure a surface profile of the substrate using the measured distance;
a memory part configured to store a measurement value acquired when the light is irradiated on a predetermined reference surface, as a reference value; and
a calculation part configured to calculate a warping amount of the substrate based on the surface profile of the substrate measured by the optical displacement meter and the reference value stored in the memory part,
wherein the rotary table includes a plurality of substrate mounting regions formed therein along the circumferential direction, the plurality of substrate mounting regions being configured to mount a plurality of substrates therein,
the device further comprising:
a substrate position acquiring part configured to acquire positions of the plurality of substrate mounting regions during the rotation of the rotary table,
wherein the calculation part calculates the warping amount of the substrate in each of the plurality of substrate mounting regions based on the positions acquired by the substrate position acquiring part.

2. The device of claim 1, wherein the optical displacement meter includes a plurality of optical displacement meters installed so as to monitor different positions on the rotary table.

3. The device of claim 2, wherein the different positions on the rotary table include a center position, an inner position and an outer position of the substrate, in a radial direction of the rotary table.

4. The device of claim 1, wherein the reference surface is a surface of the rotary table.

5. The device of claim 1, wherein the reference surface is a surface between the plurality of substrate mounting regions adjacent to each other in the rotary table, and the reference value stored in the memory part is updated each time when a surface profile of each of the plurality of substrates is measured.

6. The device of claim 1, wherein the calculation part issues an alarm signal when determining that the warping amount of at least one of the plurality of substrates exceeds a predetermined threshold value.

7. The device of claim 1, wherein, when determining that the reflected light received from at least one of the plurality of substrate mounting regions is reflected not from the substrate but from the rotary table, the calculation part determines that the substrate is separated from the at least one of the plurality of substrate mounting region, and issues an alarm signal.

8. The device of claim 1, wherein the calculation part discards a measurement value of a light reflected from an edge portion of the substrate.

9. The device of claim 1, wherein the light is a laser light, an LED light or a lamp light.

10. A substrate processing apparatus, comprising:
a processing container;
a rotary table located inside the processing container and including a plurality of substrate mounting regions formed therein along a circumferential direction;
a reaction gas supply nozzle configured to supply a reaction gas onto the rotary table; and
the substrate warping monitoring device of claim 1.

11. A substrate processing apparatus, comprising:
a processing container;
a rotary table located inside the processing container and including a plurality of substrate mounting regions formed therein along a circumferential direction;
a reaction gas supply nozzle configured to supply a reaction gas onto the rotary table;
the substrate warping monitoring device of claim 6; and
a control part configured to decelerate or stop the rotation of the rotary table when receiving the alarm signal issued from the substrate warping monitoring device.

12. A substrate warping monitoring method, comprising:
mounting a substrate on a rotary table located inside a processing container and including a substrate mounting region formed therein along a circumferential direction;
irradiating a light onto a predetermined reference surface other than a surface of the substrate using an optical displacement meter and receiving a first reflected light reflected from the predetermined reference surface;
storing a measurement value of the first reflected light as a first reference value;
irradiating the light onto a predetermined position on the rotary table, receiving a second reflected light reflected from the rotary table and the substrate which pass through the predetermined position, measuring a distance between the optical displacement meter and the substrate using the second reflected light, and measuring a surface profile of the substrate using the measured distance by rotating the rotary table on which the substrate is mounted, by the optical displacement meter; and
calculating a warping amount of the substrate based on the surface profile of the substrate measured by the optical displacement meter and the first reference value,
wherein a plurality of substrate mounting regions is formed in the rotary table along the circumferential direction so as to mount a plurality of substrates in the plurality of substrate mounting regions, respectively,
the method further comprising:
acquiring positions of the plurality of substrate mounting regions during the rotation of the rotary table,
wherein the calculating a warping amount of the substrate includes calculating warping amounts of the plurality of substrates mounted in the plurality of substrate mounting regions, respectively.

13. The method of claim 12, further comprising:
storing, as second reference values, measurement values of reflected lights reflected from different positions in the substrate using a plurality of optical displacement meters;
measuring the surface profile of the substrate using the plurality of optical displacement meters; and
determining a shape of the substrate.

14. The method of claim 13, wherein the different positions include a center position, an inner position and an outer position in the substrate, in a radial direction of the rotary table.

15. The method of claim 12, wherein the reference surface is a surface of the rotary table.

16. The method of claim 12, wherein the reference surface is a surface between the plurality of substrate mounting regions adjacent to each other in the rotary table,
wherein the reference value stored in the storing is updated each time the surface profile of each of the plurality of substrates is measured.

17. The method of claim 12, wherein the calculating a warping amount of the substrate includes:
determining whether a warping amount of at least one of the plurality of substrates exceeds a predetermined threshold value; and
performing at least one of decelerating or stopping the rotation of the rotary table when determining that the warping amount of the at least one of the plurality of substrates exceeds the predetermined threshold value.

18. The method of claim 12, wherein the calculating a warping amount of the substrate includes:
determining whether a third reflected light received from at least one substrate mounting region among the plurality of substrate mounting regions is reflected from the rotary table or the substrate;
judging that the substrate is separated from the at least one substrate mounting region, when determining whether the third reflected light is reflected from the rotary table; and
stopping the rotation of the rotary table.

19. The method of claim 12, wherein the calculating a warping amount of the substrate includes discarding a measurement value of a fourth reflected light reflected from an edge portion of the substrate.

20. The method of claim 12, wherein the measuring a surface profile of the substrate and the calculating a warping amount of the substrate are performed while processing the substrate.

21. The method of claim 12, wherein the light is a laser light, an LED light or a lamp light.

* * * * *